United States Patent
Cadee et al.

(10) Patent No.: US 7,304,715 B2
(45) Date of Patent: Dec. 4, 2007

(54) LITHOGRAPHIC APPARATUS AND DEVICE MANUFACTURING METHOD

(75) Inventors: Theodorus Petrus Maria Cadee, Vlierden (NL); Joost Jeroen Ottens, Veldhoven (NL); Jeroen Johannes Sophia Maria Mertens, Duizel (NL); Frederick Eduard De Jong, Eindhoven (NL); Koen Goorman, Eindhoven (NL); Boris Menchtchikov, Eindhoven (NL); Marco Koert Stavenga, Eindhoven (NL); Martin Frans Pierre Smeets, Veldhoven (NL); Aschwin Lodewijk Hendricus Johannes Van Meer, Roosendaal (NL); Bart Leonard Peter Schoondermark, Arnhem (NL); Patricius Aloysius Jacobus Tinnemans, Hapert (NL); Stoyan Nihtianov, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 45 days.

(21) Appl. No.: 10/917,535

(22) Filed: Aug. 13, 2004

(65) Prior Publication Data

US 2006/0033892 A1 Feb. 16, 2006

(51) Int. Cl.
 G03B 27/52 (2006.01)
 G03B 27/42 (2006.01)
(52) U.S. Cl. .......................... 355/30; 355/53
(58) Field of Classification Search ............... 355/30, 355/53, 67; 250/548
 See application file for complete search history.

(56) References Cited

U.S. PATENT DOCUMENTS

| 3,573,975 A | 4/1971 | Dhaka et al. ............... 117/212 |
| 3,648,587 A | 3/1972 | Stevens ........................ 95/44 |
| 4,213,698 A | 7/1980 | Firtion et al. |
| 4,346,164 A | 8/1982 | Tabarelli et al. ............ 430/311 |
| 4,390,273 A | 6/1983 | Loebach et al. ............ 355/125 |
| 4,396,705 A | 8/1983 | Akeyama et al. ........... 430/326 |
| 4,480,910 A | 11/1984 | Takanashi et al. ............ 355/30 |

(Continued)

FOREIGN PATENT DOCUMENTS

DE 206 607 2/1984

(Continued)

OTHER PUBLICATIONS

U.S. Appl. No. 10/773,461, filed Feb. 9, 2004, Duineveld et al.

(Continued)

*Primary Examiner*—Peter B. Kim
(74) *Attorney, Agent, or Firm*—Pillsbury Winthrop Shaw Pittman LLP

(57) ABSTRACT

A lithographic apparatus is disclosed. The apparatus includes an illumination system configured to condition a radiation beam, and a support constructed to support a patterning device. The patterning device is capable of imparting the radiation beam with a pattern in its cross-section to form a patterned radiation beam. The apparatus also includes a substrate table constructed to hold a substrate, a projection system configured to project the patterned radiation beam onto a target portion of the substrate, a liquid supply system configured to at least partly fill a space between the projection system and the substrate with liquid, a seal member arranged to substantially contain the liquid within the space, and elements to control and/or compensate for evaporation of immersion liquid from the substrate.

39 Claims, 17 Drawing Sheets

U.S. PATENT DOCUMENTS

| | | | | |
|---|---|---|---|---|
| 4,503,335 A * | 3/1985 | Takahashi | | 250/548 |
| 4,509,852 A | 4/1985 | Tabarelli et al. | | 355/30 |
| 4,564,284 A | 1/1986 | Tsutsui | | |
| 5,034,688 A * | 7/1991 | Moulene et al. | | 324/760 |
| 5,040,020 A | 8/1991 | Rauschenbach et al. | | 355/53 |
| 5,121,256 A | 6/1992 | Corle et al. | | 359/664 |
| 5,610,683 A | 3/1997 | Takahashi | | 355/53 |
| 5,715,039 A | 2/1998 | Fukuda et al. | | 355/53 |
| 5,825,043 A | 10/1998 | Suwa | | 250/548 |
| 5,900,354 A | 5/1999 | Batchelder | | 430/395 |
| 6,191,429 B1 | 2/2001 | Suwa | | 250/548 |
| 6,236,634 B1 | 5/2001 | Lee et al. | | 369/112 |
| 6,556,414 B2 | 4/2003 | Kosakai | | 361/234 |
| 6,560,032 B2 | 5/2003 | Hatano | | 359/656 |
| 6,600,547 B2 | 7/2003 | Watson et al. | | |
| 6,603,130 B1 | 8/2003 | Bisschops et al. | | 250/492.1 |
| 6,633,365 B2 | 10/2003 | Suenaga | | 355/53 |
| 6,882,403 B1 | 4/2005 | Shirata | | |
| 2002/0002944 A1* | 1/2002 | Shirley | | 118/666 |
| 2002/0020821 A1 | 2/2002 | Van Santen et al. | | 250/492 |
| 2002/0163629 A1 | 11/2002 | Switkes et al. | | 355/53 |
| 2003/0123040 A1 | 7/2003 | Almogy | | 355/69 |
| 2003/0174408 A1 | 9/2003 | Rostalski et al. | | 359/642 |
| 2004/0000627 A1 | 1/2004 | Schuster | | |
| 2004/0021844 A1 | 2/2004 | Suenaga | | |
| 2004/0075895 A1 | 4/2004 | Lin | | 359/380 |
| 2004/0109237 A1 | 6/2004 | Epple et al. | | |
| 2004/0119954 A1 | 6/2004 | Kawashima et al. | | 355/30 |
| 2004/0125351 A1 | 7/2004 | Krautschik et al. | | 355/53 |
| 2004/0130688 A1* | 7/2004 | Emoto | | 355/30 |
| 2005/0146694 A1 | 7/2005 | Tokita | | |
| 2005/0213066 A1 | 9/2005 | Sumiyoshi | | |
| 2005/0213067 A1 | 9/2005 | Van Der Feltz et al. | | 355/67 |
| 2005/0259234 A1 | 11/2005 | Hirukawa et al. | | 355/53 |
| 2005/0286033 A1* | 12/2005 | Lin et al. | | 355/53 |
| 2006/0033898 A1 | 2/2006 | Cadee et al. | | 355/53 |
| 2006/0033901 A1* | 2/2006 | Hara | | 355/53 |

FOREIGN PATENT DOCUMENTS

| | | |
|---|---|---|
| DE | 221 563 | 4/1985 |
| DE | 224448 | 7/1985 |
| DE | 242880 | 2/1987 |
| EP | 0023231 | 2/1981 |
| EP | 0418427 | 3/1991 |
| EP | 1039511 | 9/2000 |
| EP | 1 420 298 A2 | 5/2004 |
| EP | 1 420 300 A2 | 5/2004 |
| EP | 1 420 300 A3 | 8/2005 |
| EP | 1 420 298 A3 | 10/2005 |
| EP | 1 650 604 A2 | 4/2006 |
| FR | 2474708 | 7/1981 |
| GB | 2 138 163 A | 10/1984 |
| JP | 58-202448 | 11/1983 |
| JP | 62-065326 | 3/1987 |
| JP | 62-121417 | 6/1987 |
| JP | 63-157419 | 6/1988 |
| JP | 4-028216 | 1/1992 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-284405 | 10/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| TW | 454233 B | 9/2001 |
| WO | WO 92/05432 | 4/1992 |
| WO | WO 99/49504 | 9/1999 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2005/071491 A2 | 8/2005 |
| WO | WO 2005/076324 | 8/2005 |

OTHER PUBLICATIONS

U.S. Appl. No. 10/698,012, filed Oct. 31, 2003, Flagello et al.
U.S. Appl. No. 10/705,804, filed Nov. 12, 2003, De Smit et al.
U.S. Appl. No. 10/705,805, filed Nov. 12, 2003, Lof et al.
U.S. Appl. No. 10/705,783, filed Nov. 12, 2003, Lof et al.
U.S. Appl. No. 10/743,271, filed Dec. 23, 2003, Van Santen et al.
U.S. Appl. No. 10/743,266, filed Dec. 23, 2003, Mulkens et al.
U.S. Appl. No. 10/705,785, filed Nov. 12, 2003, Derksen et al.
U.S. Appl. No. 10/724,402, filed Dec. 1, 2003, Simon et al.
U.S. Appl. No. 10/715,116, filed Nov. 18, 2003, Bleeker.
U.S. Appl. No. 10/719,683, filed Nov. 24, 2003, Streefkerk et al.
U.S. Appl. No. 10/705,816, filed Nov. 12, 2003, Lof et al.
U.S. Appl. No. 10/775,326, filed Feb. 11, 2004, Dierichs.
U.S. Appl. No. 10/367,910, filed Feb. 19, 2003, Suwa et al.
M. Switkes et al., "Immersion Lithography at 157 nm", MIT Lincoln Lab, Orlando Jan. 2001, Dec. 17, 2001.
M. Switkes et al., "Immersion Lithography at 157 nm", J. Vac. Sci. Technol. B., vol. 19, No. 6, Nov./Dec. 2001, pp. 2353-2356.
M. Switkes et al., "Immersion Lithography: Optics for the 50 nm Node", 157 Anvers-1, Sep. 4, 2002.
B.J. Lin, "Drivers, Prospects and Challenges for Immersion Lithography", TSMC, Inc., Sep. 2002.
B.J. Lin, "Proximity Printing Through Liquid", IBM Technical Disclosure Bulletin, vol. 20, No. 11B, Apr. 1978, p. 4997.
B.J. Lin, "The Paths To Subhalf-Micrometer Optical Lithography", SPIE vol. 922, Optical/Laser Microlithography (1988), pp. 256-269.
G.W.W. Stevens, "Reduction of Waste Resulting from Mask Defects", Solid State Technology, Aug. 1978, vol. 21 008, pp. 68-72.
S. Owa et al., "Immersion Lithography; its potential performance and issues", SPIE Microlithography 2003, 5040-186, Feb. 27, 2003.
S. Owa et al., "Advantage and Feasibility of Immersion Lithography", Proc. SPIE 5040 (2003).
Nikon Precision Europe GmbH, "Investor Relations—Nikon's Real Solutions", May 15, 2003.
H. Kawata et al., "Optical Projection Lithography using Lenses with Numerical Apertures Greater than Unity", Microelectronic Engineering 9 (1989), pp. 31-36.
J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.
B.W. Smith et al., "Immersion Optical Lithography at 193nm", Future Fab International, vol. 15, Jul. 11, 2003.
H. Kawata et al., "Fabrication of 0.2 μm Fine Patterns Using Optical Projection Lithography with an Oil Immersion Lens", Jpn. J. Appl. Phys. vol. 31 (1992), pp. 4174-4177.
G. Owen et al., "⅛ μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update of 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial $\lambda$/NA scaling equations for resolution, depth of focus, and immersion lithography, *J. Microlith., Microfab., Microsyst.* 1(1):7-12 (2002).

European Search Report for EP Patent Application No. 05254783.3, dated Jan. 10, 2006.

T. Honda et al., "ArF Immersion Lithography: Critical Optical Issues", Proc. of SPIE, vol. 5377, pp. 319-328, May 2004.

European Search Report issued for European Patent Application No. 06251863.4-1226, dated Sep. 25, 2006.

Australian Search Report issued for Singapore Patent Application No. 200505017-4, dated Aug. 21, 2006.

Korean Office Action issued for Korean Patent Application No. 10-2005-0074411, dated Sep. 27, 2006.

Taiwanese Office Action issued for Taiwan Patent Application No. 094127593, dated Jun. 12, 2007.

\* cited by examiner

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, which is incorporated herein by reference in its entirety) means that there is a large body of liquid that must be accelerated during a scanning exposure. This requires additional or more powerful motors, and turbulence in the liquid may lead to undesirable and unpredictable effects.

One of the solutions proposed is for a liquid supply system to provide liquid on only a localized area of the substrate and in between the projection system and the substrate using a liquid confinement system (the substrate generally has a larger surface area than this surface of the projection system). One way which has been proposed to arrange for this is disclosed in WO 99/49504, which is incorporated herein by reference in its entirety. As illustrated in FIGS. 2 and 3, liquid is supplied by at least one inlet IN onto the substrate, preferably along the direction of movement of the substrate relative to the projection system, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2, the liquid is supplied along the direction of movement of the substrate relative to the projection system, although this does not need to be the case. Various orientations and numbers of in- and out-lets positioned around the projection system are possible. One example is illustrated in FIG. 3, in which four sets of an inlet with an outlet on either side are provided in a regular pattern around the projection system.

Another solution which has been proposed is to provide the liquid supply system with a seal member which extends along at least a part of a boundary of the space between the projection system and the substrate table. Such a solution is illustrated in FIG. 4. The seal member 12' is substantially stationary relative to the projection system PL in the XY plane, although there may be some relative movement in the Z direction (in the direction of the optical axis). A seal is formed between the seal member 12' and the surface of the substrate W. Preferably the seal is a contactless seal such as a gas seal. Such as system with a gas seal is disclosed in European Patent Application No. 03252955.4, which is incorporated herein by reference in its entirety.

In European Patent Application No. 03257072.3, the idea of a twin or dual stage immersion lithography apparatus is disclosed. Such an apparatus is provided with two stages for supporting the substrate. Leveling measurements are carried out with a stage at a first position, without immersion liquid, and exposure is carried out with a stage at a second position, where immersion liquid is present. Alternatively, the apparatus has only one stage.

Although providing improved resolution, the introduction of an immersion liquid has been found to cause errors in the image generated on the substrate, including alignment errors between one layer and the next (i.e. overlay errors), defocus, and aberrations. It is, therefore, desirable to provide a system that reduces lithography errors arising from the immersion liquid.

SUMMARY

According to an aspect of the invention, there is provided a lithographic apparatus that includes: an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; a liquid supply system configured to at least partly fill a space between the projection system and the substrate with liquid; a seal member arranged to substantially contain the liquid within the space between the projection system and the substrate; and a liquid evaporation controller arranged to control a net rate of evaporation of the liquid supplied by the liquid supply system.

According to an aspect of the invention, there is provided a lithographic apparatus that includes: an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; a liquid supply system configured to at least partly fill a space between the projection system and the substrate with liquid; a seal member arranged to substantially contain the liquid within the space; and a substrate table scanning system, arranged to move the substrate table along a predetermined scanning path relative to the seal member, thereby scanning the target portion over the surface of the substrate; and a substrate heater configured to heat at least a portion of the substrate according to a position of the substrate table relative to the seal member, or a velocity of the substrate table relative to the seal member, or an acceleration of the substrate table relative to the seal member, or a scanning path of the substrate table relative to the seal member, or a local substrate temperature, or a local substrate table temperature, or any combination thereof.

According to an aspect of the invention, there is provided a lithographic apparatus that includes: an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; a liquid supply system configured to at least partly fill a space between the projection system and the substrate with liquid; a seal member arranged to substantially contain the liquid within the space between the projection system and the substrate; and a gas seal configured to control an amount of liquid that escapes from the seal member through a gap delimited on one side by a boundary of the seal member and on a second side by the substrate, the gas seal including a gas outlet, through which gas is supplied to the region within the gap, and a vacuum exhaust inlet, through which gas supplied by the gas outlet is removed from the region within the gap, the gas outlet and the vacuum exhaust inlet being respectively connected to a gas outlet pipe and a vacuum exhaust inlet pipe embedded in the seal member, wherein the seal member further includes a seal member temperature stabilizer.

According to an aspect of the invention, there is provided a lithographic apparatus that includes: an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; a liquid supply system configured to at least partly fill a space between the projection system and the substrate with liquid; a seal member arranged to substantially contain the liquid within the space between the projection system and the substrate; a substrate table heat-exchange fluid controller for controlling a temperature and flow rate of a heat-exchange fluid arranged to flow through a network of channels embedded in the substrate table.

According to an aspect of the invention, there is provided a lithographic apparatus that includes: an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate, wherein the substrate table includes at least one integrated local temperature control system including a temperature sensor coupled with a heater, the heater being configured to generate heat when a local temperature as measured by the temperature sensor falls below a predetermined reference value and to stop generating heat when the local temperature rises above the predetermined reference value.

According to an aspect of the invention, there is provided a lithographic apparatus that includes: an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; at least one temperature sensor configured to measure a temperature of at least a portion of the substrate, or at least a portion of the substrate table, or at least a portion of a substrate holder, or any combination thereof; and a projection system controller, configured to adjust at least one property of the patterned radiation beam in response to the temperature measured by the at least one temperature sensor.

According to an aspect of the invention, there is provided a device manufacturing method that includes: patterning a radiation beam with a patterning device; projecting the patterned radiation beam with a projection system onto a target portion of a substrate; at least partially filling a space between said projection system and said substrate with liquid supplied by a liquid supply system; and controlling a net rate of evaporation of said liquid.

According to an aspect of the invention, there is provided a device manufacturing method that includes: patterning a radiation beam with a patterning device; projecting the patterned radiation beam with a projection system onto a target portion of a substrate supported by a substrate table; at least partially filling a space between said projection system and said substrate with liquid supplied by a liquid supply system; substantially containing said liquid within said space with a seal member; moving said substrate table along a predetermined path relative to said seal member, thereby moving said target portion over a surface of said substrate; and heating at least a portion of said substrate according to a position of the substrate table relative to the seal member, or a velocity of the substrate table relative to the seal member, or an acceleration of the substrate table relative to the seal member, or a predetermined path of said substrate table relative to said seal member, or a local substrate temperature, or a local substrate table temperature, or any combination thereof.

According to an aspect of the invention, there is provided a device manufacturing method that includes: patterning a radiation beam with a patterning device; projecting the patterned radiation beam with a projection system onto a target portion of a substrate; at least partially filling a space between said projection system and said substrate with liquid supplied by a liquid supply system; substantially containing said liquid within said space with a seal member; controlling an amount of liquid that escapes from said seal member through a gap delimited on one side by a boundary of said seal member and on a second side by said substrate with a gas seal; supplying a gas to a region within said gap through a gas inlet of a gas seal, said gas inlet being connected to a gas inlet pipe; removing said gas from said region within said gap through a vacuum exhaust outlet of the gas seal, said vacuum exhaust outlet being connected to a vacuum exhaust outlet pipe embedded in said seal member; and stabilizing a temperature of said seal member.

According to an aspect of the invention, there is provided a device manufacturing method that includes: patterning a radiation beam with a patterning device; projecting the patterned radiation beam with a projection system onto a target portion of a substrate supported by a substrate table; at least partially filling a space between said projection system and said substrate with liquid supplied by a liquid supply system; substantially containing said liquid within said space with a seal member; and controlling a temperature and flow rate of a heat-exchange fluid arranged to flow through a network of channels embedded in said substrate table.

According to an aspect of the invention, there is provided a device manufacturing method that includes: patterning a radiation beam with a patterning device; projecting the patterned radiation beam with a projection system onto a target portion of a substrate supported by a substrate table, said substrate table comprising at least one integrated local temperature control system comprising a temperature sensor coupled with a heater; and generating heat when a local temperature as measured by said temperature sensor falls below a predetermined reference value and ceasing to generate heat when said local temperature rises above said predetermined reference value.

According to an aspect of the invention, there is provided a device manufacturing method that includes: patterning a radiation beam with a patterning device; projecting the patterned radiation beam with a projection system onto a target portion of a substrate supported by a substrate table; measuring a temperature of at least a portion of said substrate, or at least a portion of said substrate table, or at least a portion of a substrate holder, or any combination thereof, with at least one temperature sensor; and adjusting at least one property of said patterned radiation beam in response to said temperature measured by said temperature sensor.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
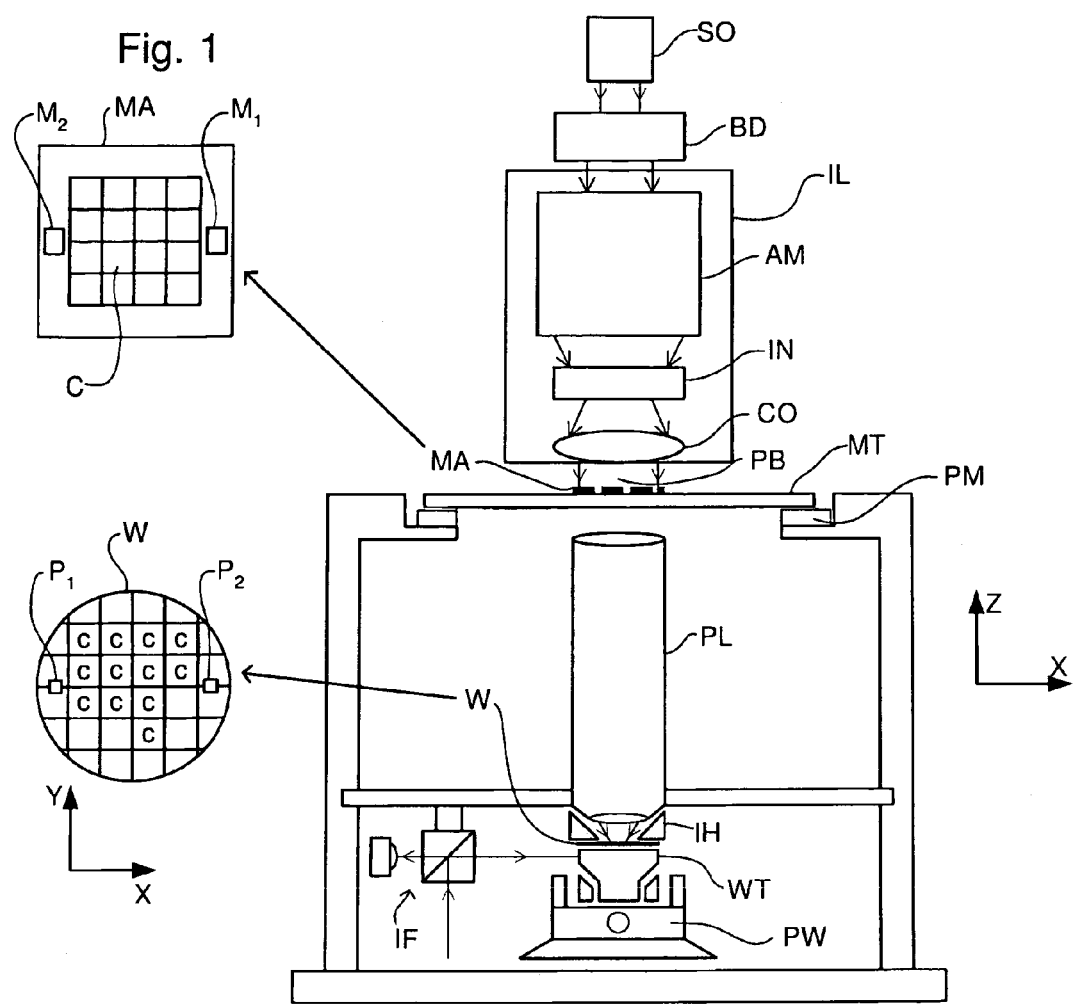
FIG. 1 depicts a lithographic apparatus according to an embodiment of the invention.
Figure 2:
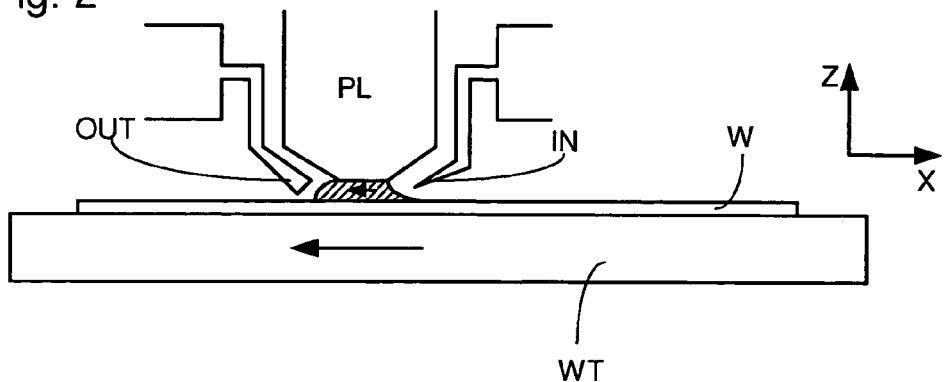
FIGS. 2 and 3 depict a liquid supply system used in a prior art lithographic projection apparatus.
Figure 3:
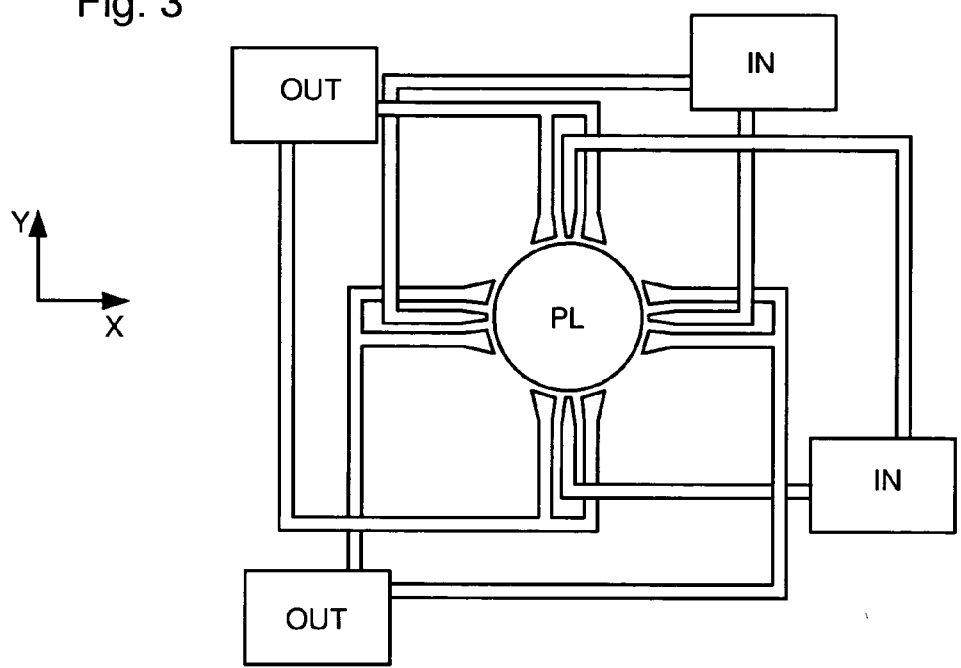
Figure 4:
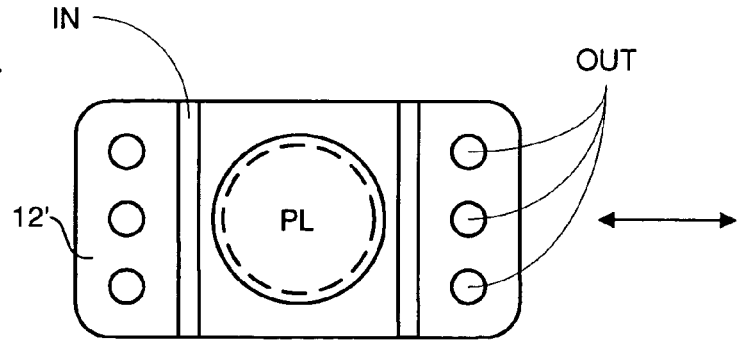
FIG. 4 depicts a liquid supply system according to another prior art lithographic projection apparatus.
Figure 4:
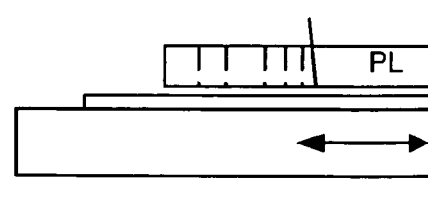

FIG. 1 schematically depicts a lithographic apparatus according to one embodiment of the invention. The apparatus includes an illumination system (illuminator) IL configured to condition a radiation beam PB (e.g. UV radiation or DUV radiation), a support structure (e.g. a mask table) MT constructed to support a patterning device (e.g. a mask) MA and connected to a first positioner PM configured to accurately position the patterning device MA in accordance with certain parameters, a substrate table (e.g. a wafer table) WT constructed to hold a substrate (e.g. a resist-coated wafer) W and connected to a second positioner PW configured to accurately position the substrate in accordance with certain parameters, and a projection system (e.g. a refractive projection lens system) PL configured to project a pattern imparted to the radiation beam PB by the patterning device MA onto a target portion C (e.g. including one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT supports, i.e. bears the weight of, the patterning device MA. It holds the patterning device MA in a manner that depends on the orientation of the patterning device, the design of the lithographic apparatus, and other conditions, such as, for example, whether or not the patterning device MA is held in a vacuum environment.

The support structure MT may use mechanical, vacuum, electrostatic, or other clamping techniques to hold the patterning device MA. The support structure MT may be a frame or a table, for example, which may be fixed or movable as required. The support structure MT may ensure that the patterning device MA is at a desired position, for example, with respect to the projection system PL. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example, if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which may be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The substrate W may be held directly by the substrate table WT (sometimes referred to as a mirror block) and may be held by a substrate holder (sometimes referred to as a burl plate or chuck), which is in turn held by the substrate table WT.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases, the source may be an integral part of the lithographic apparatus, for example, when the source is a mercury lamp. The source SO and the illuminator IL, together with the beam delivery system BD, if required, may be referred to as a radiation system.

The illuminator IL may include an adjuster AM for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam PB is incident on the patterning device MA (e.g., mask), which is held on the support structure MT (e.g., mask table), and is patterned by the patterning device MA. Having traversed the patterning device MA, the radiation beam PB passes through the projection system PL, which focuses the beam onto a target portion C of the substrate W. With the aid of the second positioner PW and position sensor IF (e.g. an interferometric device, linear encoder or capacitive sensor), the substrate table WT may be moved accurately, e.g. so as to position different target portions C in the path of the radiation beam B. Similarly, the first positioner PM and another position sensor (which is not explicitly depicted in FIG. 1) may be used to accurately position the patterning device MA with respect to the path of the radiation beam PB, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper, as opposed to a scanner, the support structure MT may be connected to a short-stroke actuator only, or may be fixed. The patterning device MA and the substrate W may be aligned using patterning device alignment marks M1, M2 and substrate alignment marks P1, P2. Although the substrate alignment marks P1, P2, as illustrated, occupy dedicated target portions, they may be located in spaces between target portions (these are known as scribe-lane alignment marks). Similarly, in situations in which more than one die is provided on the patterning device MA, the patterning device alignment marks M1, M2 may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-) magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

According to an aspect of the invention, overlay errors and other problems linked to the presence of an immersion liquid and seal member may be reduced by a liquid evaporation controller, which targets and controls the rate of evaporation of immersion liquid in the region of the substrate. Molecules of liquid absorb energy from the surroundings in order to evaporate and, if pumped away, the cooling that results may result in significant and non-uniform variations in the temperature of critical components such as the substrate W. Thermally-induced distortions may lead to errors in the image finally written to the substrate. For example, evaporation of immersion liquid left behind on the substrate after the seal member has passed by may cause local temperature drops of up to 3K. As a result of this, over 20 nm single machine overlay error might result.

Figure 5:
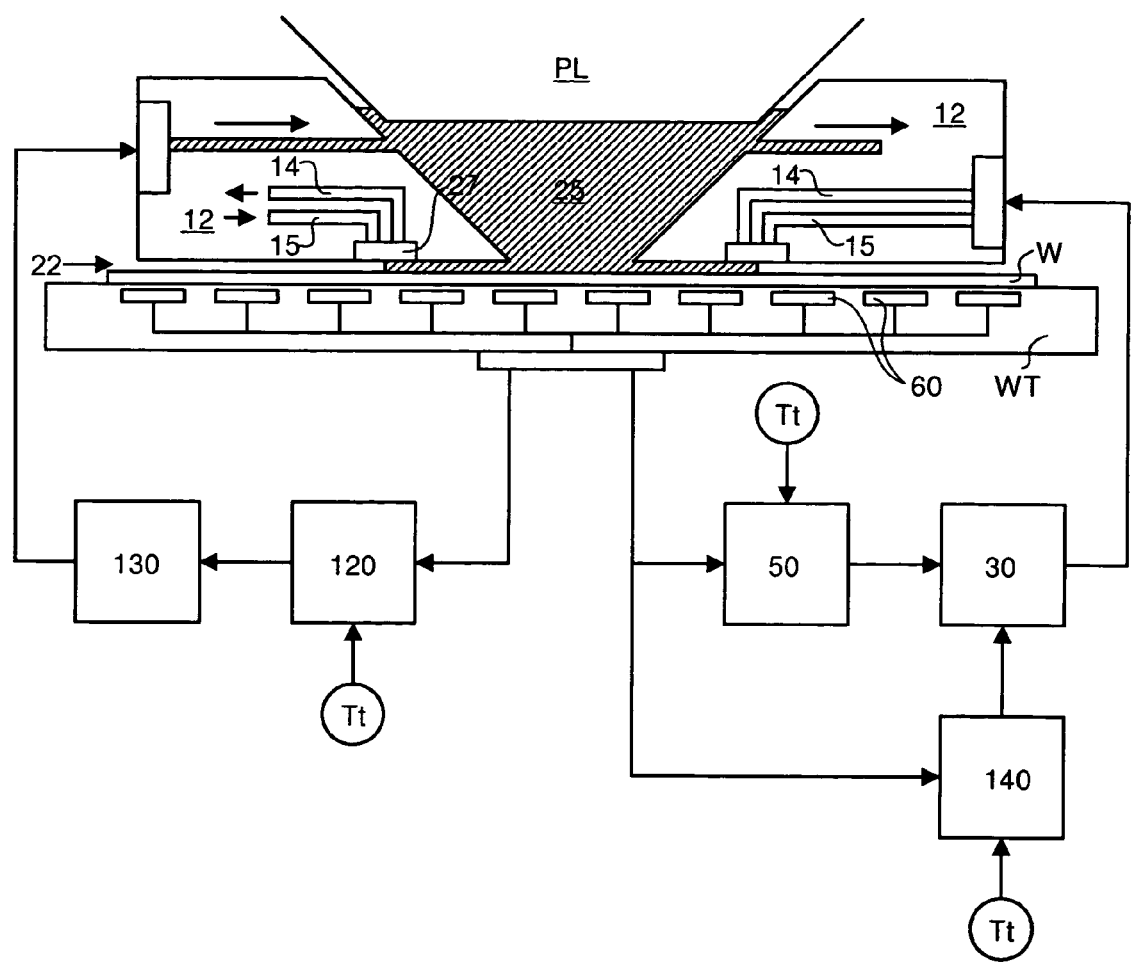
FIG. 5 depicts a seal member according to an embodiment of the invention, showing interaction with a pressurized gas humidity controller, an immersion liquid temperature controller and a pressurized gas temperature controller.

FIG. 5 shows an arrangement of a seal member 12 according to an embodiment of the invention. Immersion liquid is contained within an immersion reservoir 25 located between the projection system PL and the substrate W. The immersion liquid is contained within the immersion reservoir 25 by the body of the seal member 12 and by a gas seal 27 on its lower periphery, which limits the amount of immersion liquid that escapes from the immersion reservoir 25 through gap 22. The gas seal 27 is connected to a pressurized gas supply system 30, which supplies pressurized gas to the gas seal 27 via a pressurized gas outlet and a pressurized gas supply pipe 15. Gas is pumped away via a vacuum exhaust inlet and a vacuum exhaust pipe 14. The immersion liquid that evaporates in the region of the gas seal 27 may be pumped away via the vacuum exhaust inlet. Alternatively, liquid that escapes beyond the gas seal 27 either into the region underneath the seal member 12 in the gap 22 or beyond the outer edges of the seal member 12, may evaporate into the environment outside the substrate W outside of the seal member 12.

Where a substance exists both in liquid form and in gaseous form, a dynamic equilibrium will normally exist, with a rate of evaporation of the liquid being balanced against a rate of condensation of the vapor. The amount of cooling caused by evaporation will therefore be offset by a heating caused by condensation (where high energy gaseous molecules yield energy to their surroundings as part of the transition to the lower energy liquid state). The cooling power therefore depends on the net rate of evaporation (i.e. the difference between the number of molecules entering the gaseous state from the liquid per unit time and the number of molecules entering the liquid state from the gaseous state per unit time). Both condensation and evaporation are statistical effects and increasing the number of molecules involved will increase the rate of either process. Therefore, increasing the vapor concentration will increase the rate of condensation and lead to a reduction in the net rate of evaporation. When the vapor consists of water molecules, this concentration is directly related to the relative humidity, defined as the amount of water vapor present as a percentage of the maximum quantity that could be present at a given temperature.

This understanding is exploited according to an embodiment of the invention to control the cooling caused by evaporation of immersion liquid. As illustrated in FIG. 5, a pressurized gas humidity controller 50, which is configured to interact with the pressurized gas supply system 30 to provide pressurized gas to the gas seal 27 with a relative humidity controlled to be greater than about 10%. Increasing the relative humidity of the gas increases the rate of condensation and therefore decreases the net rate of evaporation and the cooling caused thereby. Preferably, the relative humidity is arranged to be within a predetermined range determined by reference to calibration measurements. For the purposes of controlling cooling, in general, the higher the relative humidity, the better. However, for very high relative humidities, the seal member 12 may leave excessive quantities of water in its wake. Furthermore, if insufficient mechanisms are provided for humid gas extraction near the outer diameter of the seal member, humid gas may leave and interfere with the operation of the position sensor IF. Therefore, the upper limit will in general be dependent on details of the seal member construction and/or configuration. Additionally or alternatively, the predetermined range may be greater than about 40%. High relative humidities such as these may be achieved by using lower working pressures than might otherwise be selected for the purposes of achieving optimal sealing properties (6 bar may typically be used). Ideally, a working pressure should be chosen that is as close as possible to atmospheric pressure, while still providing a sufficient flow rate for the gas seal 27 to perform its function. The lower the working pressure, the less the relative humidity will be reduced when the pressurized gas expands upon leaving the pressurized gas supply system 30.

The pressurized gas humidity controller 50 may be arranged to be responsive to changes in the temperature of the substrate W and/or substrate table WT. These temperature changes may be determined via one or more temperature sensors 60 arranged, for example, in the substrate table WT. According to an embodiment of the invention, the pressurized gas humidity controller 50 is arranged to compare the temperatures of the substrate W and/or substrate table WT and/or substrate holder, measured at one or more points by the temperature sensor(s) 60, with a target temperature or temperatures Tt. That is to say, where a single temperature sensor 60 is present, the pressurized gas humidity controller 50 compares this one temperature reading with a single target temperature Tt. Where a plurality of temperature sensors 60 are present, the pressurized gas humidity controller 50 compares a plurality of readings with a single target temperature Tt, or with a plurality of target temperatures Tt corresponding, for example, to particular regions of the substrate W and/or corresponding regions of the substrate table/substrate holder, and, therefore, to particular groups of temperature sensor readings (within which an average reading may be used). The pressurized gas humidity controller 50 may then adjust the relative humidity of the pressurized gas in order to reduce a difference between the measured and target temperature(s), the efficiency of the process may be controlled by a feedback controller, such as a PID system.

Figure 6:
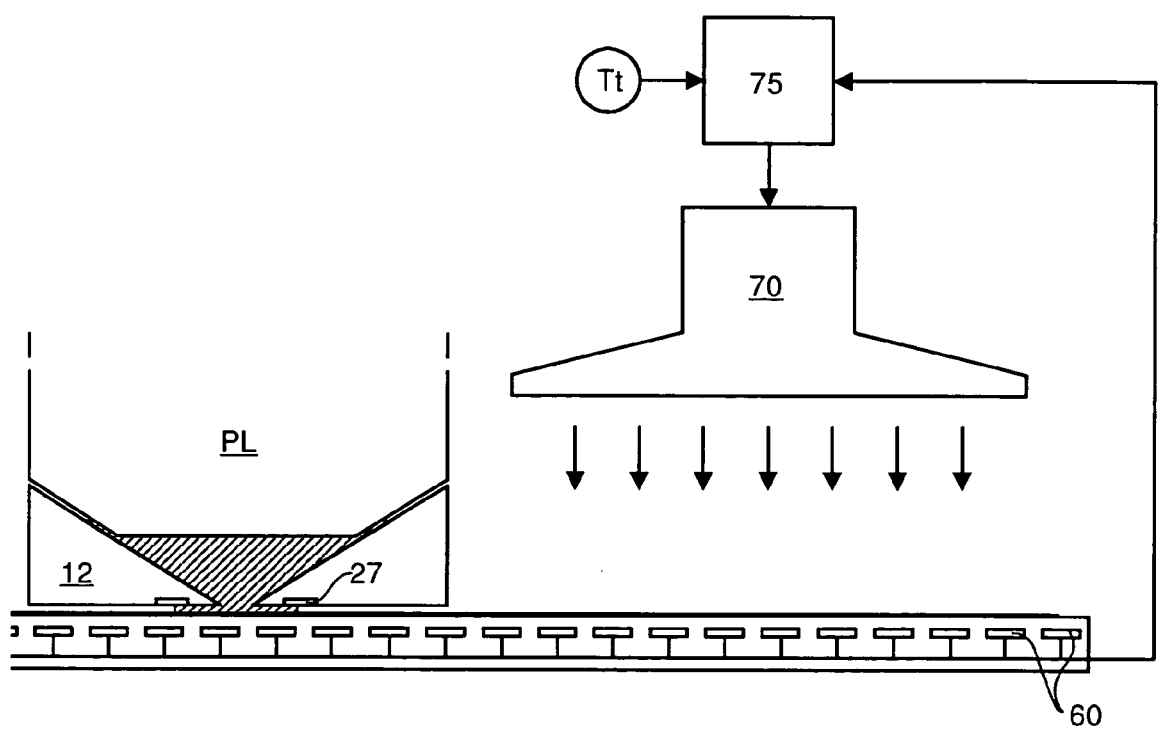
FIG. 6 depicts a seal member, gas-shower outlet and gas-shower outlet controller according to an embodiment of the invention.

Adjusting the humidity of the gas supplied to the gas seal 27 may be most efficient for cooling caused by evaporation in the region of the gas seal 27, particularly around the vacuum exhaust inlet 18 and vacuum exhaust pipe 14. It is preferable to have an additional mechanism to control the net evaporation of liquid beyond the gas seal 27 and outside of the seal member 12. Such an arrangement, according to an embodiment of the invention, is illustrated in FIG. 6. Here, a gas-shower outlet 70 is provided that is capable of providing a flow of gas with a relative humidity controlled to be greater than about 10%. A gas-shower humidity controller 75 is provided that is capable of adjusting the relative humidity in accordance with calibration measurements, calculations, or measurements of the temperature at one or various points on the substrate W and/or substrate table/substrate holder, as provided by one or more temperature sensors 60, and comparing them with a target temperature or temperatures Tt. A preferred range of relative humidity in this case is about 40 to about 50%. In the case where the gas-shower humidity controller 75 is arranged to respond to temperature measurements, it may adjust the relative humidity of the gas in order to reduce a difference or differences between the measured and target temperature(s) Tt. That is to say, where a single temperature sensor 60 is present, the gas-shower humidity controller 75 compares this one temperature reading with a single target temperature Tt. Where a plurality of temperature sensors 60 are present, the gas-shower humidity controller 75 compares a plurality of readings with a single target temperature Tt, or with a plurality of target temperatures Tt corresponding, for example, to particular regions of the substrate W and/or corresponding regions of the substrate table/substrate holder, and, therefore, to particular groups of temperature sensor readings (within which an average reading may be used). A feedback controller, such as a PID system, may control the efficiency of the process.

The gas-shower humidity controller 75 may be arranged to interact with the pressurized gas humidity controller 50 so as to ensure that the relative humidity of the gases provided by the gas seal 27 and the gas-shower outlet 70 are matched. This feature provides a mechanism in which variations in the relative humidity outside of the gas seal 27 may be controlled, and disturbances to systems, such as the interferometers used to measure the position of the substrate table WT, that might otherwise occur may be avoided.

The substrate table WT is normally arranged to be moved relative to the projection system PL and the seal member 12 by a substrate table displacement system 100 (see FIG. 8), so that consecutive target regions of the substrate W may be exposed by the patterned radiation beam. This process may encourage small quantities of immersion liquid to leave the confines of the immersion reservoir 25 in spite of the operation of the gas seal 27. Embodiments arranged to reduce component cooling caused by reducing immersion liquid evaporation have been discussed above. According to an alternative aspect of the invention, errors caused by the cooling effects of evaporating immersion liquid may be reduced by providing a substrate heater, configured to heat at least a portion of the substrate W according to one of the position, velocity, acceleration, or predetermined path of the substrate table WT relative to the seal member 12, the local substrate W and/or substrate table WT temperature, or any combination thereof. The substrate heater may provide heating via a number of mechanisms. These may include an infra-red emission source, a glow wire electrical resistance heater, or a hot gas jet, or any combination thereof. Factors when deciding which kind of heater to use may include how finely and quickly the heating power needs to be adjusted, as well as how effectively the heater can be produced in miniature form. The latter factor may become more or less important depending on whether the heater needs to be embedded in or near the material whose temperature it is intended to regulate (such as a glow wire, for example, embedded in the substrate table WT), or whether the heater works to some extent at a distance (such as a radiation-emitting source or temperature-controlled gas jet source). In the case of a radiation-emitting source, the wavelength distribution of the radiation should be chosen so as not to react with resist compositions on the substrate W (infra-red radiation would be safe in this regard for most resists of interest). Selection of radiation intensity will depend on the optical properties of the resist (such as its reflectivity). This may be determined by calibration measurements during a set-up sequence of the lithography apparatus. Where there is likely to be a process stage dependency (due to variations in the reflectivity, for example), calibration may also be carried out within the production sequence as an extra measurement phase for each lot of substrates. As shall be described below, several embodiments of the invention operate on the principle that at least a subset of the substrate heaters present are actuated during a substrate exposure sequence, i.e. as the seal member 12 passes over the substrate W. However, a system that heats the substrate W before exposure, so as to compensate for cooling that has yet to occur but is expected to occur, also falls within the scope of the invention.

Figure 7:
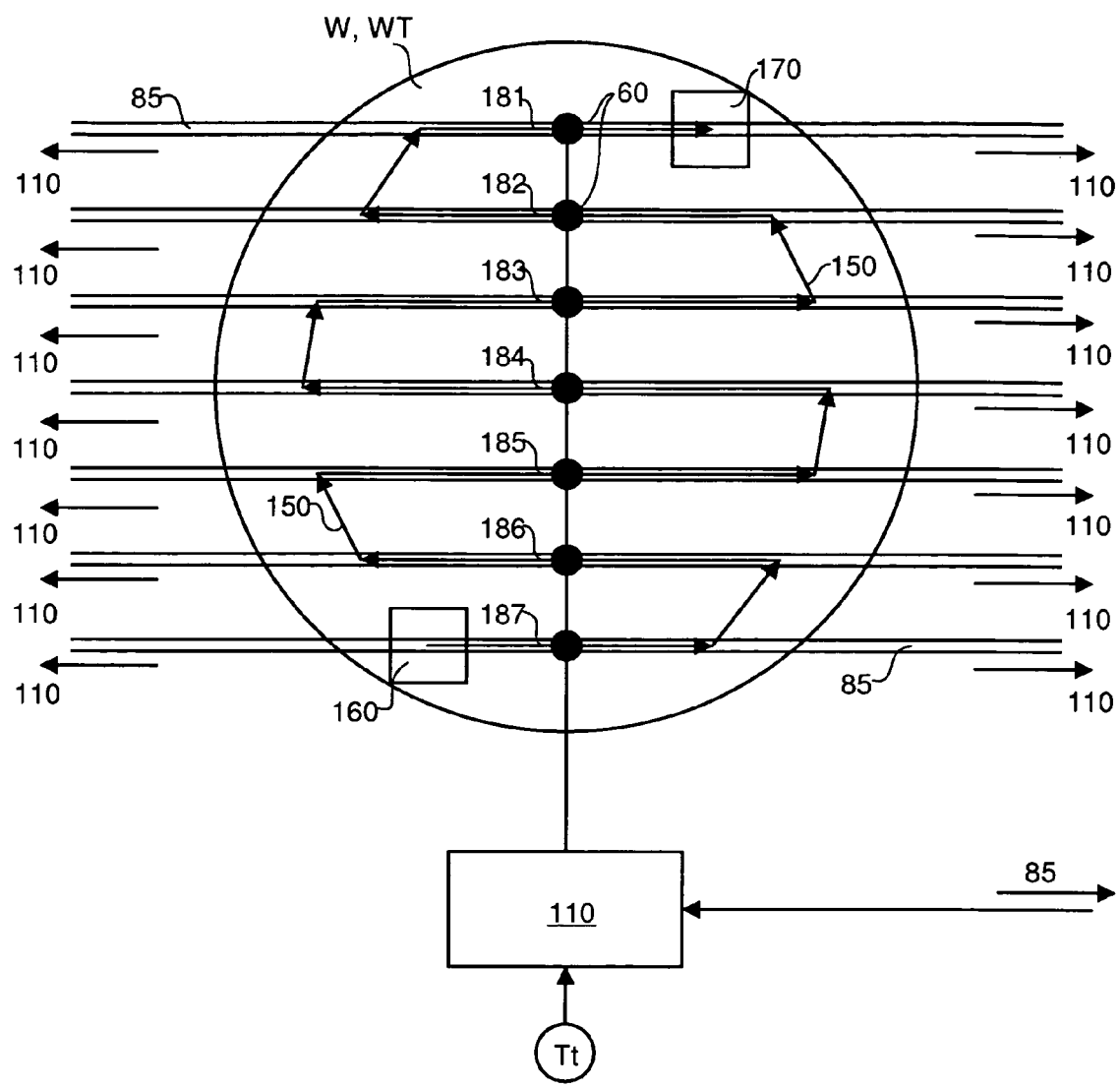
FIG. 7 depicts a top view of a substrate table including a system of local heaters and a substrate temperature controller according to an embodiment of the invention.
Figure 8:
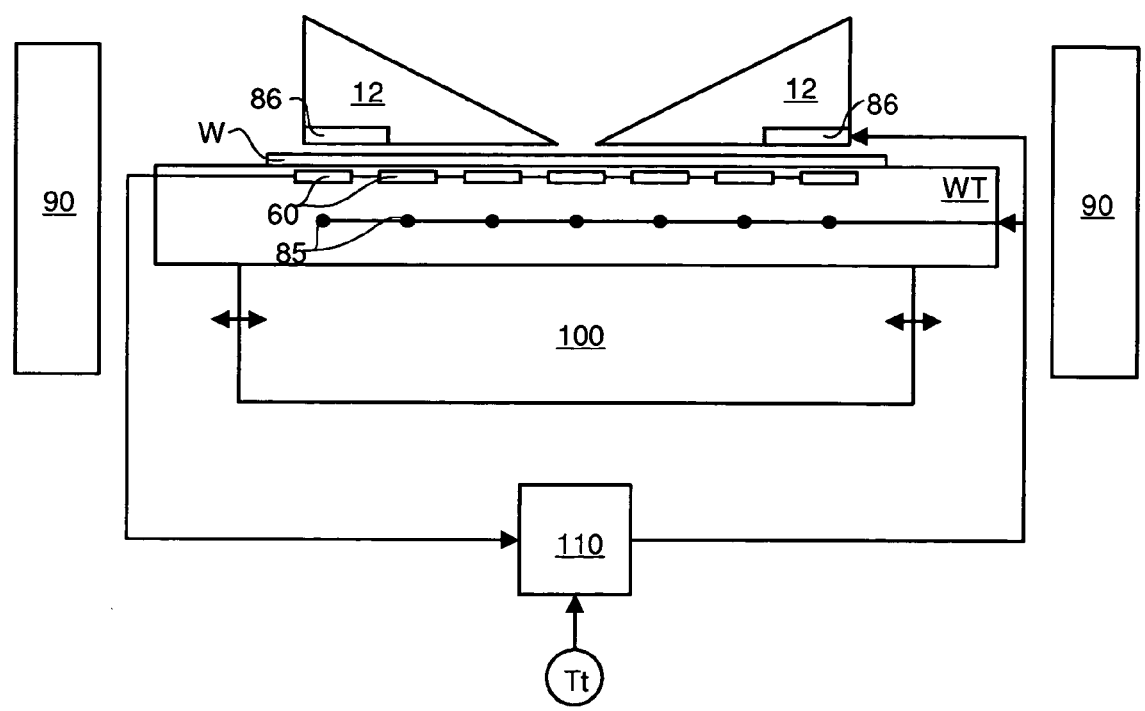
FIG. 8 depicts a side view of the substrate table of FIG. 7, showing also a plurality of temperature sensors, a substrate table path determining device and substrate heaters located in the seal member.

FIGS. 7 and 8 show an arrangement according to an embodiment of the invention, including a system of heaters 85, 86 embedded either in the substrate table as "local heaters" 85, or in the seal member 12 as "remote heaters" 86, or both. The local heaters 85 are each arranged to heat predominantly a particular region of the substrate W and together may be used to control the temperature profile of at least a portion of the substrate W. The remote heaters 86 will heat a different portion of the substrate W depending on the position of the seal member 12 relative to the substrate W.

According to a mode of operation involving the local heaters 85, the heating power and relative timing of each heater may be adjusted to set up a starting temperature profile for the substrate W at a known period of time before the substrate exposure cycle is started. By reference to calibration measurements and/or analysis of test patterns generated by the lithographic apparatus, a starting temperature profile may be selected that substantially compensates for cooling that will occur due to evaporation of immersion liquid during the exposure cycle.

According to a mode of operation involving the local heaters 85, each of these heaters 85 may be arranged to be switched to a heat-emitting state only when the seal member 12 passes over the region that they are positioned to heat. For example, in the case where the seal member 12 (and thus the target area) moves relative to the substrate W as shown in FIG. 7, along a path 150 between an initial die (or target area) 160 to a final die 170, the local heaters 85 would also be switched on in a progressive manner substantially along the same path 150. This may be achieved by programming a substrate temperature controller 110 to provide a series of time-delayed actuation signals that for each local heater 85 closely lags behind the intended path of the seal member 12 relative to the substrate table WT. The intended path may be stored in a substrate table path determining device 90. As an alternative or additional approach, the actuation sequence of the local heaters 85 may be derived from further functions of the substrate table path determining device 90. For example, the substrate table path determining device 90 may include a device (based on interferometry, for example) for measuring the position, velocity and/or acceleration of the substrate table WT and for feeding this information to the substrate temperature controller 110, which may be configured to calculate at this point when to activate each local heater 85. For example, the path determining device 90 may be configured to send an actuation signal to a given heater when it detects that the seal member 12 is moving away from, or has moved past, that particular heater. The power supplied by each local heater 85 may be arranged to be constant or time-varying, and be the same as or different to the other local heaters 85. The optimal arrangement to use for each heater is that which best compensates the power lost due to evaporation for the region concerned. In the case where the rate of loss of liquid from the seal member 12 is constant, the power to be supplied by each heater 85 once activated may be substantially the same (because once the seal member 12 has passed by, the amount of liquid left behind on the substrate W to evaporate may be found to be roughly constant).

Alternatively, it may be found that more heating power is required in certain regions, such as where the seal member 12 changes direction relative to the substrate table WT. Calibration measurements may be carried out to determine the most effective way to operate the heater powers as a function of the particular substrate table path and rate required.

The remote heaters 86 in the seal member 12 may preferably be positioned around the circumference of the seal member 12, as shown in FIG. 8. This arrangement allows the heaters to operate in close proximity to the region where the evaporation processes may be extracting the most heat. Placement near the outer diameter may be chosen as a compromise to avoid the region immediately around the gas seal 27, which in practice is already heavily occupied by holes, pipes and ducts. Because they operate at a distance from the substrate W, heater mechanisms such as those based on radiation or hot gas jets may be appropriate. Creating a hot surface in the base of the seal member 12 is one method by which a radiation source may be implemented. Thermal isolation of such a device from the rest of the seal member 12 may improve the performance of such a feature. Alternatively or additionally, infra-red bulbs may be used.

As was arranged for the local heaters 85 above, the power of the remote heaters 86 may be controlled depending on the direction of motion of the substrate table WT. For example, it may be arranged to provide more heat from one side of the seal member 12 than from the other. As one aspect of the cooling is related to evaporation of liquid escaping from the seal member 12, the remote heaters 86 on the trailing edge of the seal member 12 (where immersion liquid is likely to be escaping) may be configured to emit a higher heating power than those located on the front edge of the seal member 12 (where the substrate W is still dry). The effectiveness of the remote heaters 86 may be varied on demand by varying the power and/or width of the heaters 86 around the circumference of the seal member 12. This latter parameter may be varied, for example, by progressively activating different segments of a segmented heater 86, or one heater 86 of a plurality of heaters 86.

Although shown embedded in the substrate table WT or seal member 12, it is to be understood that the heaters 85, 86 may be positioned anywhere where they can influence the temperature of the substrate W. Radiation-emitting heaters, for example, may be positioned in a separate body distinct from the substrate table WT and seal member 12. Where the substrate W is heated prior to exposure, this may occur in a region away from that used for exposure, so as to implement more easily the remote heaters 86.

The lithographic apparatus may also include local temperature sensors 60, which in the example illustrated in FIG. 8 are embedded in the substrate table WT. According to an embodiment of the invention, these temperature sensors 60 are arranged to measure the temperature of each region of the substrate W and/or corresponding region of the substrate table/substrate holder affected by each local heater 85. This information is fed to the substrate temperature controller 110, which may then calculate how to control the output of the local heaters 85 and/or remote heaters 86 so as to reduce a difference between a target temperature or temperatures Tt and the temperatures measured by the local temperature sensors 60. In this embodiment, it may be preferable to arrange for the heaters 85 and/or 86 to have a variable rather than fixed output. In either case, a feedback controller (such as PID) may be used to optimize the efficiency of the convergence process.

Modulating the temperature of the liquid supplied by the liquid supply system 130 may also control the temperature of the substrate W and/or substrate table/substrate holder. For example, the immersion liquid may be heated to a controlled temperature greater than about 295 K. FIG. 5 shows an embodiment of the invention that includes an immersion liquid temperature controller 120 arranged to carry out this function in cooperation with the liquid supply system 130. The temperature control of the immersion liquid may be effected with reference to calibration measurements or with reference to readings from one or more temperature sensors 60 in order to select an immersion liquid temperature that will compensate effectively for evaporation heat loss. In the latter case, the output of the immersion liquid temperature controller 120 may be controlled so as to minimize a difference or differences between a target temperature or temperatures Tt and the temperature(s) provided by the temperature sensor(s) 60, the convergence process being controlled by a feedback controller, such as a PID controller. That is to say, where a single temperature sensor 60 is present, the immersion liquid temperature controller 120 compares this one temperature reading with a single target temperature Tt. Where a plurality of temperature sensors 60 are present, the immersion liquid temperature controller 120 compares a plurality of readings with a single target temperature Tt, or with a plurality of target temperatures Tt corresponding, for example, to particular regions of the substrate W and/or corresponding regions of the substrate table/substrate holder, and therefore to particular groups of temperature sensor readings (within which an average reading may be used).

Modulating the temperature of the gas supplied by the pressurized gas supply system 30 may also control the temperature of the substrate W and/or substrate table/substrate holder. For example, the pressurized gas may be heated to a controlled temperature greater than about 300 K. The lower temperature limit here is higher than that required for the immersion liquid temperature controller 120 described above due to the lower heat capacity of the gas relative to the liquid. According to one embodiment of the invention, pressurized gas is provided at temperatures in the range of about 300 to about 320 K. FIG. 5 shows an embodiment of the invention including a pressurized gas temperature controller 140 arranged to carry out the temperature control function in cooperation with the pressurized gas supply system 30. The temperature control of the pressurized gas may be effected with reference to calibration measurements or with reference to readings from one or more temperature sensors 60. In the latter case, the output of the pressurized gas temperature controller 140 may be controlled so as to minimize a difference or differences between a target temperature or temperatures Tt and the temperature(s) provided by the temperature sensors 60, the convergence process being controlled by a feedback controller, such as a PID controller. That is to say, where a single temperature sensor 60 is present, the pressurized gas temperature controller 140 compares this one temperature reading with a single target temperature Tt. Where a plurality of temperature sensors 60 are present, the pressurized gas temperature controller 140 compares a plurality of readings with a single target temperature Tt, or with a plurality of target temperatures Tt corresponding, for example, to particular regions of the substrate W and/or corresponding regions of the substrate table/substrate holder, and therefore to particular groups of temperature sensor readings (within which an average reading may be used).

As has already been discussed, the substrate heating requirements have a positional dependence that may be at least in part determined by the path of the seal member 12 over the substrate W. At least two processes have been identified as contributing to the cooling process: evaporation of liquid in the gap 22 between the substrate W and the seal member 12, and evaporation of residual liquid left on the substrate W after exposure, if the exposed area is left wet. The cooling power of the seal member 12 (i.e. cooling from the first process) is constant in time although it depends on, inter alia, the velocity of the seal member 12 relative to the substrate W. The cooling power of the second process depends on, inter alia, the amount of liquid left on the substrate W. The amount of cooling that needs to be compensated is in general a complex function of both processes, leading to a cooling power with a complex positional dependence. Thermal conduction within the substrate W will also be a factor, meaning that unexposed areas of the substrate W may start to cool even before the seal member 12 reaches them due to cooling in exposed portions of the substrate W. Taking one process at a time, however, it is possible to make some estimations. For example, considering only the direct cooling from evaporation of residual immersion liquid on the substrate W, a substrate exposure configured to take about 30 seconds, with a time between a last exposure and substrate unloading of about 5 seconds, and an exposure sequence such as that labeled 150 in FIG. 7, about 20% to about 30% more heat may be expected to be extracted by this mechanism at the location 160 of the first exposure than at location 170 of the last exposure. In certain embodiments described above including substrate heaters 85, 86, this effect was taken into account by delaying the action of individual heaters along the path of the seal member 12. A similar effect may also be achieved by configuring the substrate heater to provide a higher heating power at target regions on the substrate W where the projection system PL is configured to project the patterned radiation beam at a first time and provide progressively lower heating powers at target regions on the substrate W where the projection system PL is configured to project the patterned radiation beam at later times. This arrangement may be varied to give a more complex position-dependent heating depending on the cooling characteristics of a particular setup that have to be compensated.

Although it may be technically possible to position a large number of local heaters 85 at many different locations on the substrate W, it is, in practice, almost as effective and significantly less expensive to provide a more limited number of heaters and position them to substantially follow the path of the seal member 12. An arrangement of this type is depicted in FIG. 7. Here, elongate substrate heaters 85, such as glow wires, are arranged so that one individually controllable element is aligned with one of the principle scanning or stepping axes 181-187 (each corresponding to a row of dies) of the seal member 12 over the substrate W. In the example shown, each glow wire 85 is arranged to emit a constant heating power per unit length and is configured so that the glow wire aligned with principle scanning or stepping axis 187 has the highest heating power, that aligned with 186 the next highest heating power and so on, progressively decreasing until the final glow wire, corresponding to principle scanning or stepping axis 181, is reached, which is assigned the lowest heating power.

Where a large number of local heaters are provided at different locations (for example, between 100 and 700 per substrate), it is preferable to position the heaters as close as possible to the surface of the substrate W. In the arrangement shown in FIGS. 7 and 8, however, where fewer heaters are provided, it is preferable to position the heaters substantially further away so that each heater may have effective control over a larger portion of the substrate W.

Figure 9:
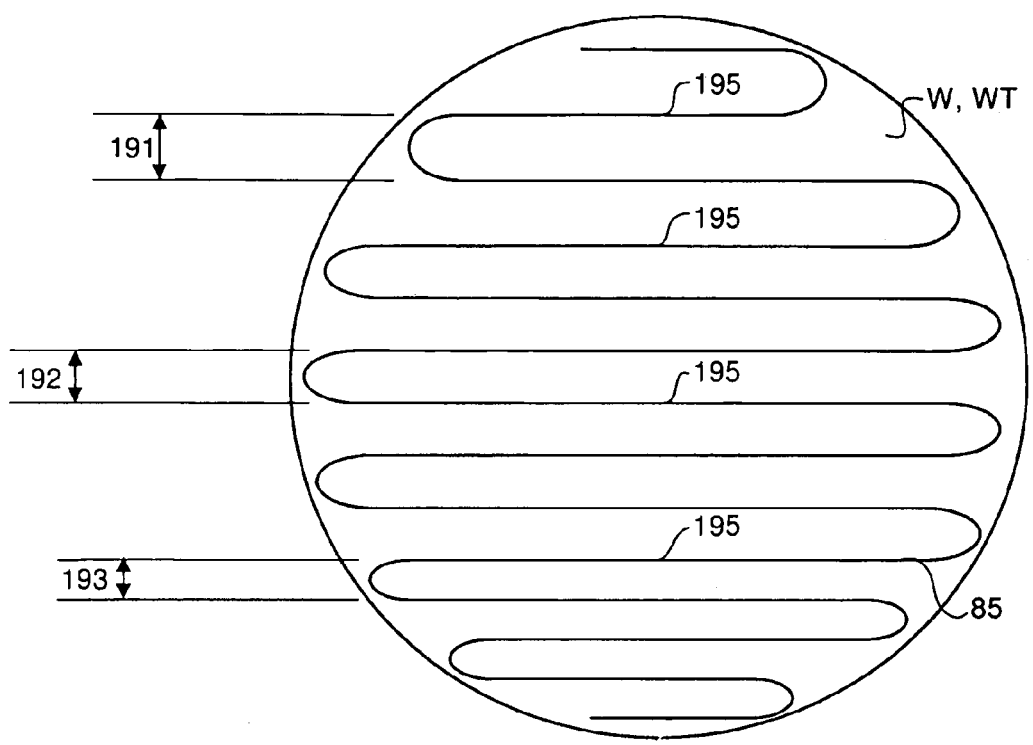
FIG. 9 depicts a top view of a substrate table showing the geometry of a substrate heater arranged to dissipate more power in the lower region of the substrate table than in the upper region.

FIG. 9 shows an arrangement in which a continuous glow wire heater 85 is provided to heat the substrate W. In the example shown, the glow wire heater 85 is arranged to follow the path of the seal member 12 to some extent in that it has longer sections 195 substantially parallel to the principle scanning axes 181-187 (i.e. perpendicular to the scanning direction) of the seal member 12 (as shown in FIG. 7). However, the pitch 191-193 between these longer sections is arranged to become shorter and shorter towards the lower end of the substrate W as depicted, which corresponds to the region within which the substrate W will be first exposed (i.e. pitch 191>pitch 192>pitch 193). This means that the glow wire heater 85 may be given the simplest and most robust construction (that where the heating power is constant per unit length, which in practice may correspond to an elongate resistive element of constant cross-section) and yet still provide a heating power that is larger towards the region within which the substrate W will be first exposed, which is the region of the substrate W that will require the largest correction for cooling effects. As an alternative and/or additional arrangement, the glow wire heater 85 may be arranged to provide a heating power per unit length that varies along its length (for example, increasing towards the lower end of the substrate W in the orientation depicted). In the case where the glow wire operates by means of electrical dissipation associated with an electric current passed along its length, variable heating power may be achieved either by varying the cross-section (for example, providing a glow wire that becomes thinner where more power is needed) or by varying the material used. In the latter arrangement, care should be taken to avoid points of high resistance where junctions are made between materials of different composition.

Figure 10:
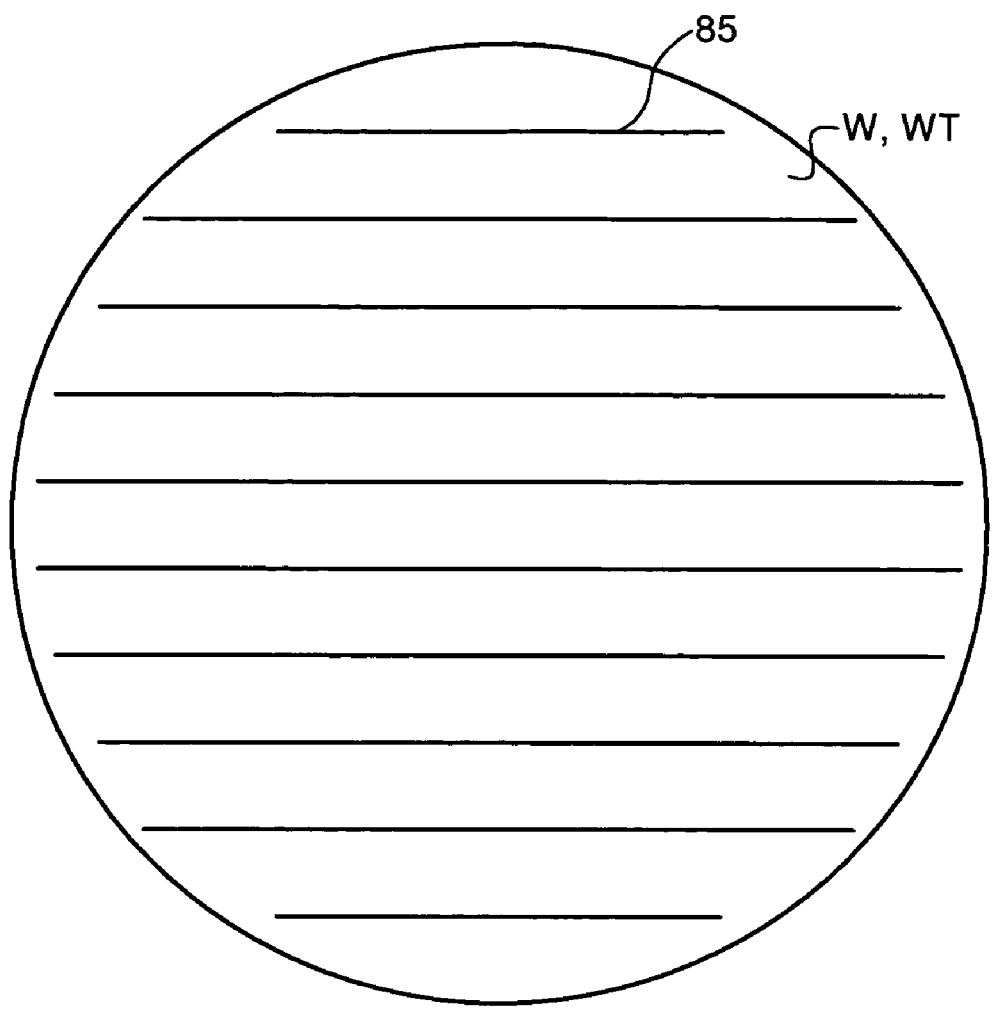
FIG. 10 depicts an array of individually controllable substrate heaters according to an embodiment of the invention.
Figure 11:
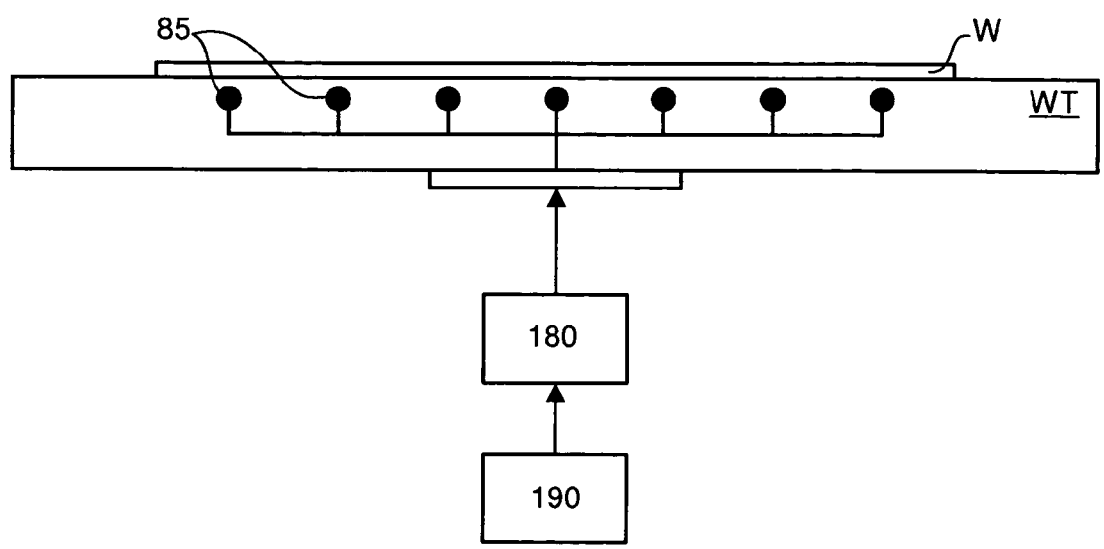
FIG. 11 depicts a side view of the arrangement of FIG. 10, showing also interaction with a heater array controller and predetermined algorithm input device.

FIGS. 10 and 11 show an arrangement wherein the substrate heater includes a system of individually controllable heaters 85. In the embodiment shown in FIG. 10, the individually controllable heaters 85 are arranged as elongate members substantially parallel to the principle scanning axes 181-187 (i.e. perpendicular to the scanning direction) and confined to heat within the geometrical limits of the substrate W. However, alternative arrangements of heaters would also be compatible with this embodiment of the invention as long as they may be controlled individually. A heater array controller 180 controls each individually controllable heater 85 via an address bus. The heater array controller 180 receives, in turn, input from a predetermined algorithm 190, which describes how the heating power of each individual heater should be controlled as a function of time (and therefore as a function of the position of the seal member 12 relative to the individual heater in question). The appropriate algorithm to use may be derived from calibration measurements and/or calculation (based, for example, on the amount of time an expected amount of liquid is expected to remain on the substrate W). This approach has the advantage of not requiring temperature sensors, which may greatly simplify construction.

Evaporation of immersion liquid may also lead to cooling of the seal member 12 itself. This effect may lead, in turn, to cooling of the substrate W, for example, by cooling the immersion liquid and/or pressurized gas by convection and/or by radiative effects. According to an aspect of the invention, a seal member temperature stabilizer is provided to reduce cooling of the substrate W by this mechanism.

Figure 12:
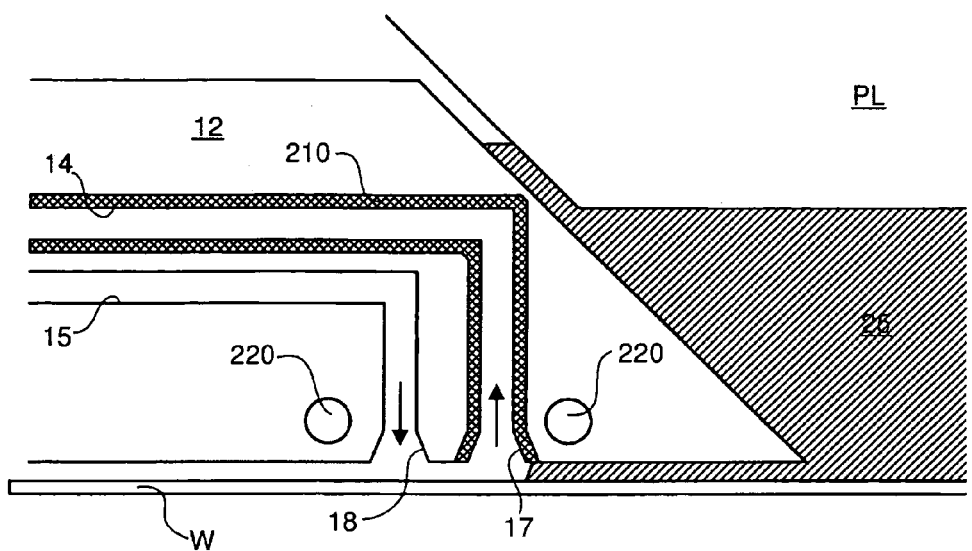
FIG. 12 depicts a partial view of a seal member according to an embodiment of the invention, showing a thermal isolation sleeve for a vacuum exhaust inlet and vacuum exhaust pipe and a seal member heater.

A region of particular concern is around the vacuum exhaust inlet 17 and in the vacuum exhaust pipe 14, shown in FIG. 12. Where immersion liquid is present in these regions, net evaporation may be particularly pronounced, as the concentration of vapor may be kept low by the vacuum system (evaporated liquid will immediately be pumped away). One way in which overall cooling of the seal member 12 due to this mechanism may be controlled is illustrated in FIG. 12, where the seal member temperature stabilizer is affected by means of a thermal isolation sleeve 210 that is arranged around the vacuum exhaust pipe 14. The thermal isolation sleeve 210 should preferably be formed from a material have very low thermal conductivity at the expected operating temperature of the lithographic apparatus. General purpose plastics, PTFE, etc. may be appropriate materials for the thermal isolation sleeve 210. Alternatively or additionally, the seal member itself may be constructed wholly or partially of a thermally isolating material. This approach may be more effective and more easily implemented than having only a thermal isolation sleeve 210, although the choice of materials with suitable mechanical characteristics may be restricted.

An additional and/or alternative approach is to provide a dedicated seal member heater 220, which is arranged to provide a compensating heating power to those areas of the seal member 12 cooled by evaporation of the immersion liquid. Although directed on the one hand to heating the seal member 12 itself, and thus, indirectly, the substrate W, the seal member heater 220 may be arranged to heat the substrate W directly. This may be achieved through the use of a radiation-emitting heater such as an infra-red heater, which has been described above in the context of possible substrate heaters 85, 86. In the arrangement shown in FIG. 12, the seal member heaters 220 are arranged around the vacuum exhaust inlet 17 and may follow the geometry of the vacuum exhaust inlet 17 in a plane perpendicular to the axis of the seal member 12 (into the page in the orientation depicted).

The heating power of the seal member heater 220 may be controlled by the seal member temperature stabilizer according to input from one or more of a number of possible sources. For example, the seal member heater power may be adjusted in response to the flow rate in the vacuum exhaust pipe 14, which may be provided by the pressurized gas supply system 30. Here, it is expected that a higher heating power may be required for higher flow rates.

The seal member heater 220 may also be controlled by reference to the temperature of the substrate W and/or substrate table/substrate holder, which may be measured at one or more positions by one or more temperature sensors 60. As with previous embodiments, a feedback controller may be employed to reduce a difference between the measured substrate temperature(s) and one or more predefined target temperatures Tt.

Figure 13:
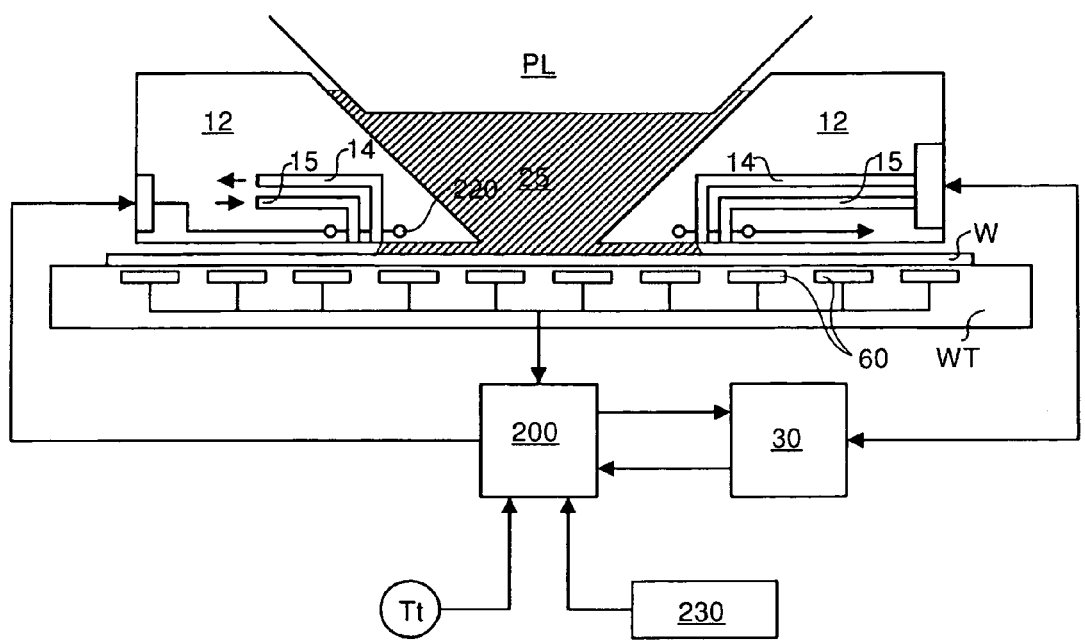
FIG. 13 depicts interaction between a seal member and seal member temperature stabilizer according to an embodiment of the invention.

The seal member heater 220 may also be controlled in response to the relative humidity of the gas supplied by the pressurized gas outlet 18. This information may be provided by humidity sensors, which may be arranged either in the seal member 12 or as part of the pressurized gas supply system 30 (the latter case being illustrated in FIG. 13).

Finally, the seal member temperature stabilizer 200 may control the output of the seal member heater 220 by reference to a calibration table 230 of required corrections, constructed from measurements of the seal member temperature as a function of substrate temperature, pressurized gas flow rate, pressurized gas flow temperature, vacuum exhaust flow rate, vacuum exhaust temperature, pressurized gas relative humidity, or immersion liquid temperature, or any combination thereof. Although calibration measurements should be undertaken, this approach greatly reduces the need to incorporate additional functional components in the final lithographic apparatus to be shipped to the customer.

Figure 14:
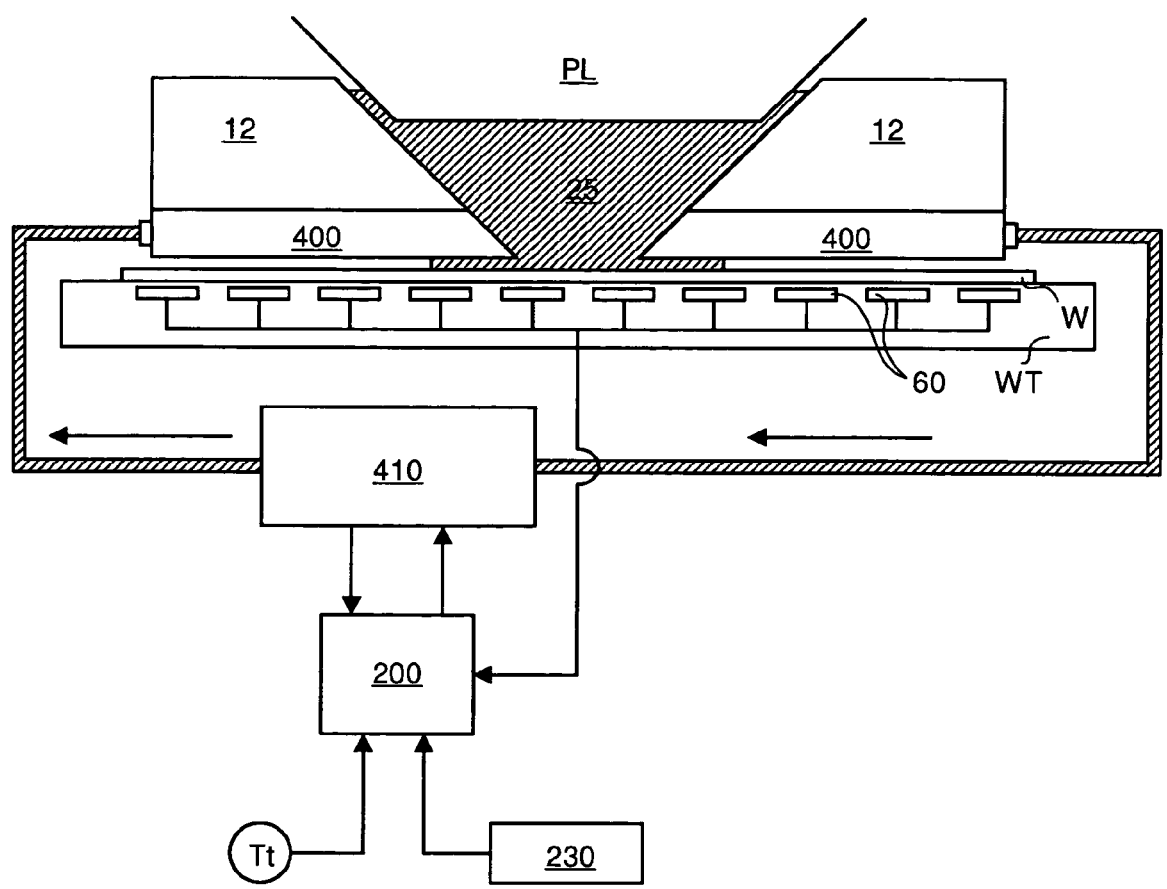
FIG. 14 depicts a seal member including a network of fluid-carrying channels and a fluid supply system according to an embodiment of the invention.
Figure 15:
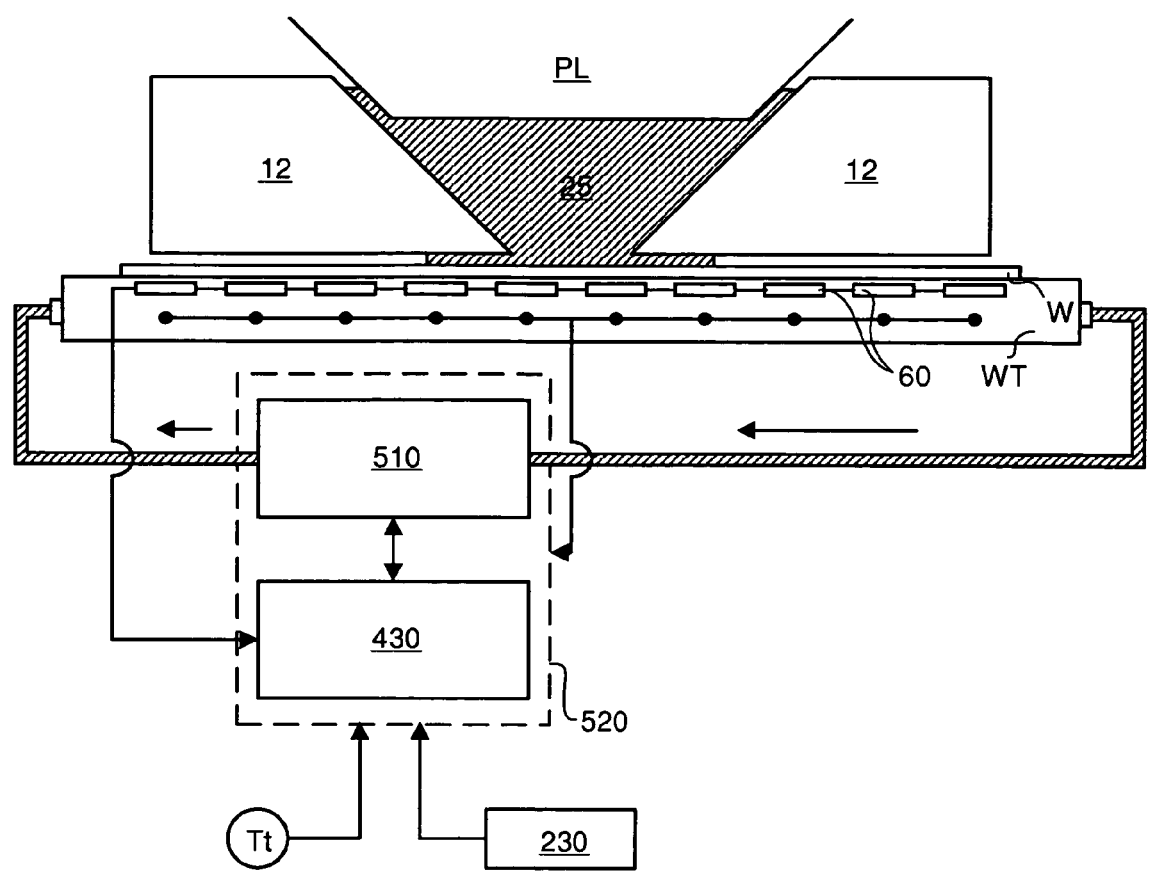
FIG. 15 depicts a seal member and substrate table including a network of fluid-carrying channels and an array of individually controllable heaters controlled by a substrate temperature controller including a substrate table heat-exchange fluid controller and a substrate heater controller.

When considering the problem of substrate cooling linked to a cooled seal member 12, an important region of the seal member 12 is that closest to and/or facing the substrate W. According to an embodiment of the invention, depicted in FIG. 14, the seal member 12 is constructed with a network of channels distributed in a layer 400 in the portion of the seal member 12 closest the substrate W. The seal member temperature stabilizer 200 is configured to control a heat-exchange fluid supply system 410 that provides a heat-exchange fluid to the network at a controlled temperature and/or flow rate. As in previous embodiments, a feedback controller may be provided to help control the substrate temperature in an efficient manner. In this case, the temperature and/or flow rate of the heat-exchange fluid provided by the fluid supply system 400 may be adjusted so as to reduce a difference between one or more substrate temperatures and/or substrate table temperatures, as measured by a system of local temperature sensors 60, and a target temperature or temperatures Tt. That is to say, where a single temperature sensor 60 is present, the fluid supply system 400 compares this one temperature reading with a single target temperature Tt Where a plurality of temperature sensors 60 are present, the fluid supply system 400 compares a plurality of readings with a single target temperature Tt, or with a plurality of target temperatures Tt corresponding, for example, to particular regions of the substrate W and/or corresponding regions of the substrate table/substrate holder, and therefore to particular groups of temperature sensor readings (within which an average reading may be used). The temperature and/or flow rate of the fluid may also be controlled by reference to a calibration table 230 of required corrections, constructed from measurements of the seal member temperature as a function of substrate temperature, pressurized gas flow rate, pressurized gas flow temperature, vacuum exhaust flow rate, vacuum exhaust temperature, pressurized gas relative humidity, or immersion liquid temperature, or any combination thereof. Although calibration measurements should be undertaken, this approach greatly reduces the need to incorporate additional functional components in the final lithographic apparatus to be shipped to the customer.

A general advantage of those embodiments described above that depend on mechanisms located in the seal member 12 is that they may be implemented without influencing the dynamic performance of the substrate table WT (this may be true both for fluid-based and electrical systems). Seal member temperature conditioning also improves not only short-term (die to die) temperature variations in the substrate W, but also long-term temperature variations from one substrate W to the next. More generally, the development costs (and development time) associated with seal member improvements are likely to be significantly lower than those involving the substrate table WT. Apart from the problems associated with controlling the dynamics of the substrate table WT, a further factor in favor of working on the seal member 12 rather than the substrate table WT relates to the flatness requirements, which are approximately 100 times more relaxed for the seal member 12. This may be important, for example, where channels are machined into the seal member 12. Introducing holes near the surface (where they are most effective) tends to introduce surface irregularities (bulges), as might variations in the pressure of the heat-exchange fluid, due to the reduced stiffness of the thin width of material left between the outer surface of the seal member and the internal channel edge.

FIGS. 15 to 18 depict an arrangement that also includes a network of fluid-carrying channels. In this arrangement, the channels are located in the substrate table WT in close proximity to the substrate W. This arrangement of channels is configured to control the temperature of the substrate W, which may be adversely affected by evaporation of immersion liquid from its top surface.

In the present embodiment, a substrate table heat-exchange fluid controller 510 is provided for controlling the temperature and flow rate of a heat-exchange fluid arranged to flow through the network of channels 500.

As in previous embodiments, a feedback controller may be provided to help control the substrate temperature in an efficient manner. In this case, the temperature and/or flow rate of the substrate table heat-exchange fluid may be adjusted so as to reduce a difference between one or more substrate temperatures and/or substrate table/substrate holder temperatures, as measured by a system of local temperature sensors 60, and a target temperature or temperatures Tt.

The arrangement may work particularly effectively if local substrate heaters, such as glow wires, are also included, so as to implement a "push-pull" principle of temperature control. According to this embodiment, a substrate temperature controller 520 controls the operation of a substrate heater controller 430 and the substrate table heat-exchange fluid controller 510. A feedback controller may be included as part of the substrate temperature controller 520, arranged to minimize a difference or differences between the substrate temperature, as measured at one or more locations on the substrate W and/or substrate table/substrate holder by local temperature sensors 60, and a target temperature or temperatures Tt. That is to say, where a single temperature sensor 60 is present, the substrate temperature controller 520 compares this one temperature reading with a single target temperature Tt. Where a plurality of temperature sensors 60 are present, the substrate temperature controller 520 compares a plurality of readings with a single target temperature Tt, or with a plurality of target temperatures Tt corresponding, for example, to particular regions of the substrate W and/or corresponding regions of the substrate table/substrate holder, and therefore to particular groups of temperature sensor readings (within which an average reading may be used). Alternatively, a feedforward loop may be used if heat flows can be calculated as a function of the velocity and position of the seal member 12 relative to the substrate W. According to the "push-pull" principle, the heat-exchange fluid controller 510 may be arranged to provide fluid at a temperature below the target temperature Tt, effectively acting to cool the substrate W. The local substrate heaters, which may be electrical resistance heaters (glow wires) as mentioned above, may respond much more quickly to sudden increases in the evaporation rate than can the heat-exchange fluid controller. Their response speed is additionally improved by being set against the cooling action of the heat-exchange fluid controller. Furthermore, should overshoot of the substrate temperature occur, the provision of the cooling heat-exchange fluid may allow a more rapid return to equilibrium than would be the case if no additional cooling mechanism was provided.

Figure 16:
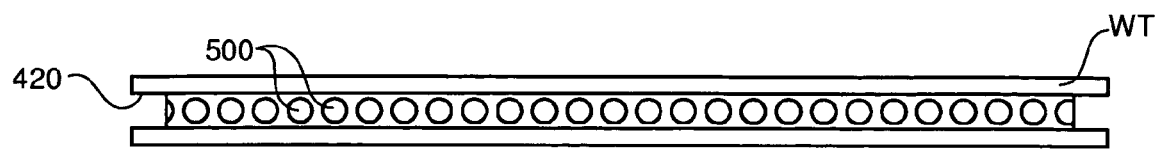
FIG. 16 depicts a substrate table with a network of channels and circular groove according to an embodiment of the invention.
Figure 17:
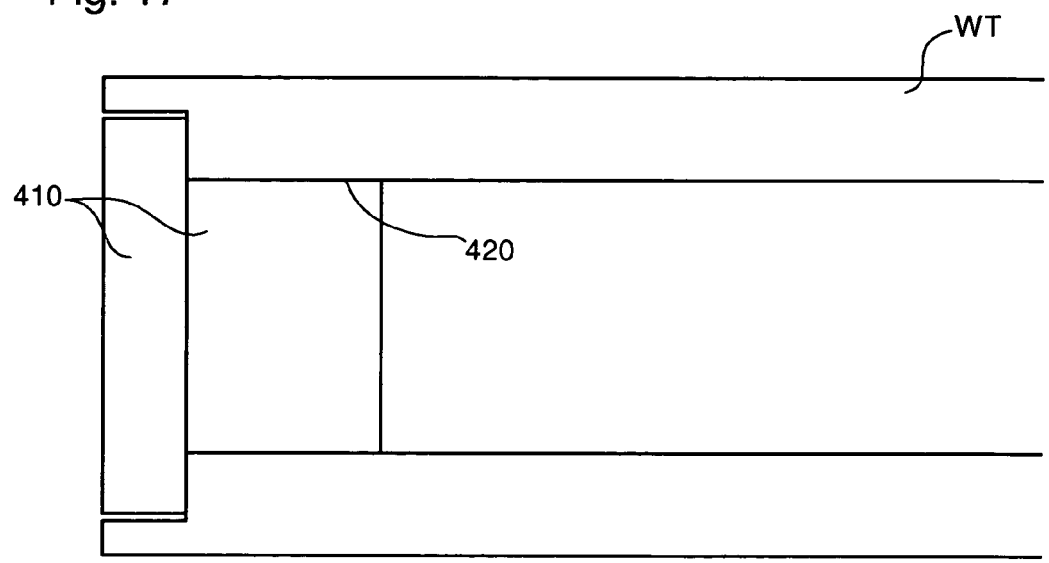
FIGS. 17 and 18 depict the substrate table with circular groove according to FIG. 16, sealed by a sealing ring according to an embodiment of the invention.
Figure 18:
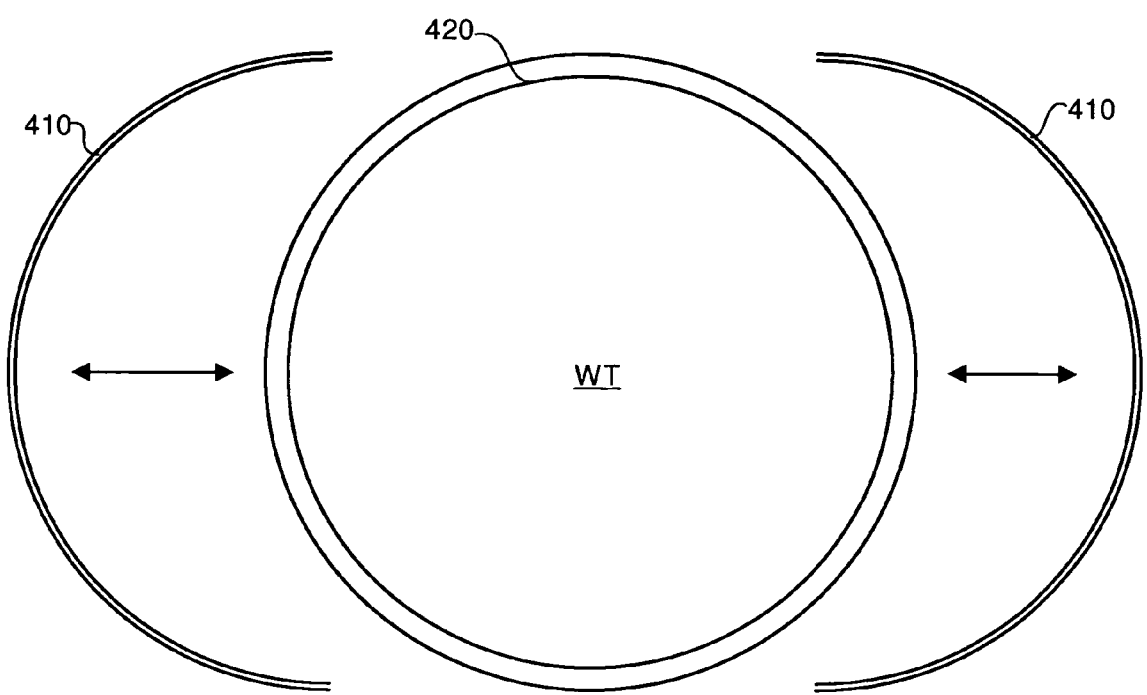

For ease of machining (among other reasons), the network of channels 500 include an array of substantially straight holes (which may be drilled) oriented in the plane of the substrate table, as depicted in FIG. 16. The ends of these straight holes should be connected and closed watertight. This may be done with plugs glued in the holes. However, in a typical configuration that includes about 4 mm holes on about an 8 mm pitch, more than 80 plugs may be required. In addition to the challenge that many individual elements need to be constructed, the possibility exists in such an arrangement that dead ends occur in which either no fluid arrives at all, or fluid is not circulated. According to an embodiment of the invention, these challenges may be overcome by providing a circular groove 420 (shown in FIGS. 16 to 18), at the edge of the substrate table WT into which all through holes can be connected in a neat fashion, without dead ends. This arrangement may have a further advantage in that fluid may be made to circulate closer to the edge of the substrate table WT. The circular groove 420 may be sealed using a much smaller number of components. In the embodiment shown, a sealing ring 410 is used, which may be split into two components for ease of assembly, and attached to the groove by glue or some other standard bonding technique. The improved fluid distribution provides a more even and controlled cooling for the substrate table WT, thereby allowing more effective thermal management and improved overlay.

Figure 19:
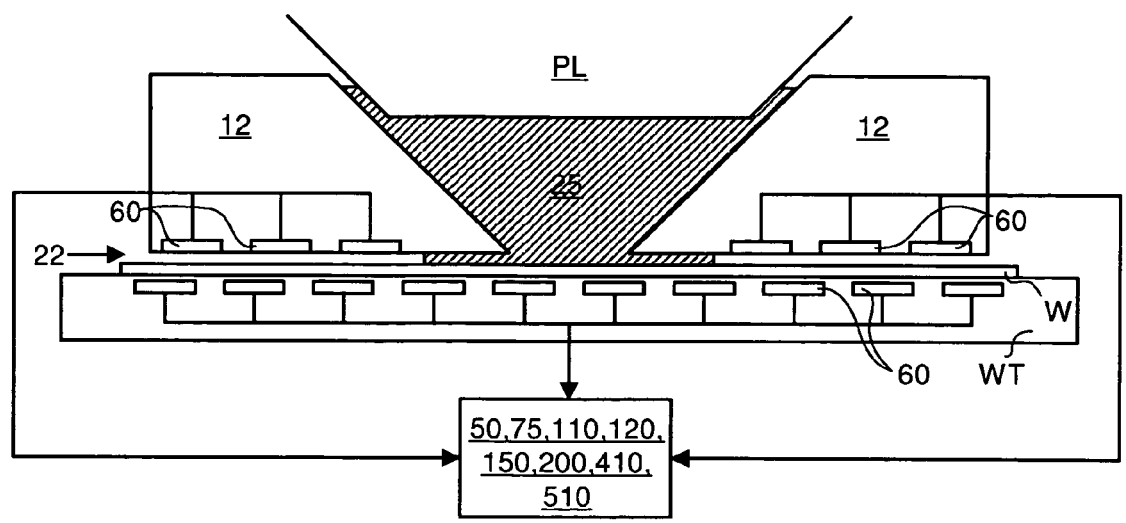
FIG. 19 depicts a lithographic apparatus showing positioning of temperature sensors in the substrate table and seal member according to an embodiment of the invention.

In the above-described embodiments, local substrate temperature sensors 60, where included, have been shown embedded in the substrate table WT close to the substrate W. These sensors may operate on a variety of principles based generally on the measurement of a calibrated and reproducible temperature-dependent property (such as electrical resistance). Although shown embedded in the substrate, the local sensors may also be positioned in the seal member 12 as shown in FIG. 19. As the thermal connection is relatively poor across the gap 22 (unlike that between the substrate W and sensors when embedded in the substrate table WT, where a high thermal conductance can more easily be arranged), it is preferable that sensors 60 located in the seal member 12 operate by analyzing radiation emitted from the substrate W. According to an embodiment of the invention, sensors 60 of this type are provided that include a radiation capture and analysis device that is capable of determining an intensity spectrum of captured radiation over a range of wavelengths. In general, the temperature may be determined most accurately if a wide range of wavelengths are chosen.

However, for the temperatures of interest in the present application, it is cost-efficient to choose a limited wavelength range encompassing and/or centered on the infra-red radiation band.

Figure 20:
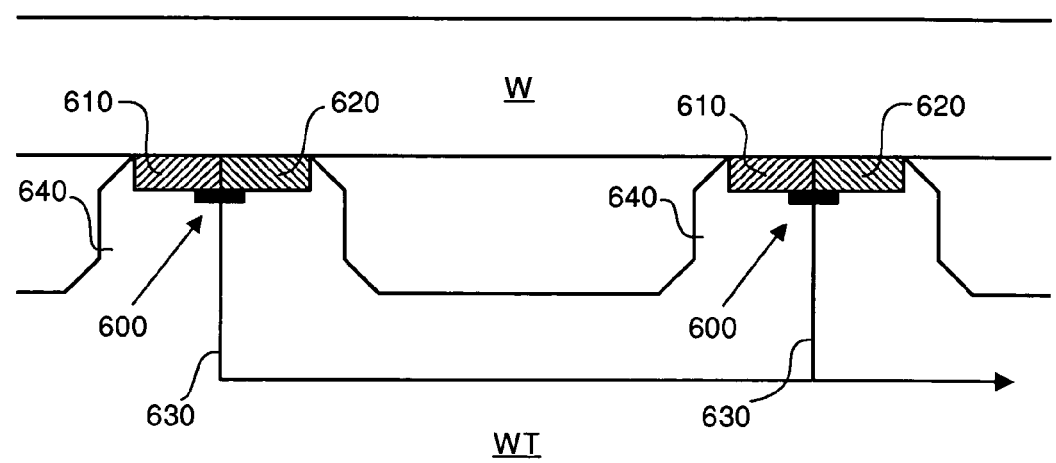
FIG. 20 depicts an enlarged view of the substrate table in the region of the substrate showing an arrangement of miniature temperature control systems according to an embodiment of the invention.

FIG. 20 shows an embodiment of the invention, in which local miniature temperature control systems 600 are built into the substrate table WT. In the example shown, these control systems 600 are positioned near the tips of raised portions of the substrate table WT (burl tops 640), which are in turn in contact with the substrate W. Each miniature control system 600 includes a miniature temperature sensor 610, which may be realized as a micro-power integrated circuit temperature sensor, and a miniature heater 620, which may be realized as an integrated circuit heater (dissipating heat resistively). The miniature control systems 600 are arranged so that the heater component 620 is activated to emit heat when the local temperature of the substrate, as measured by the miniature temperature sensor 610, falls below a predetermined threshold value. Once the temperature is increased such that it passes again through the threshold value, the miniature control system 600 is configured to switch the miniature heater off. This arrangement may have the advantages of being able to provide highly localized temperature control due to the miniature size of the control systems 600 and also of not needing a separate external control system to control the heaters 620. Only two wires (connection 630) will be required to supply voltage to all of the miniature control systems 600 in the substrate table WT. Construction of the miniature temperature sensors 600 in the burl tops 640 may be carried out by forming the substrate table WT from a silicon wafer. Microfabrication techniques, such as MEMS (Micro-Electro-Mechanical Systems) and CMOS (Complementary Metal Oxide Semiconductor) technologies, may be used to provide an exact reproduction of the standard substrate table WT construction, while also adding the integrated-circuit temperature sensor/heater 610/620 on each burl top 640 and providing the means for connecting them electrically to the external world (connection 630).

Figure 21:
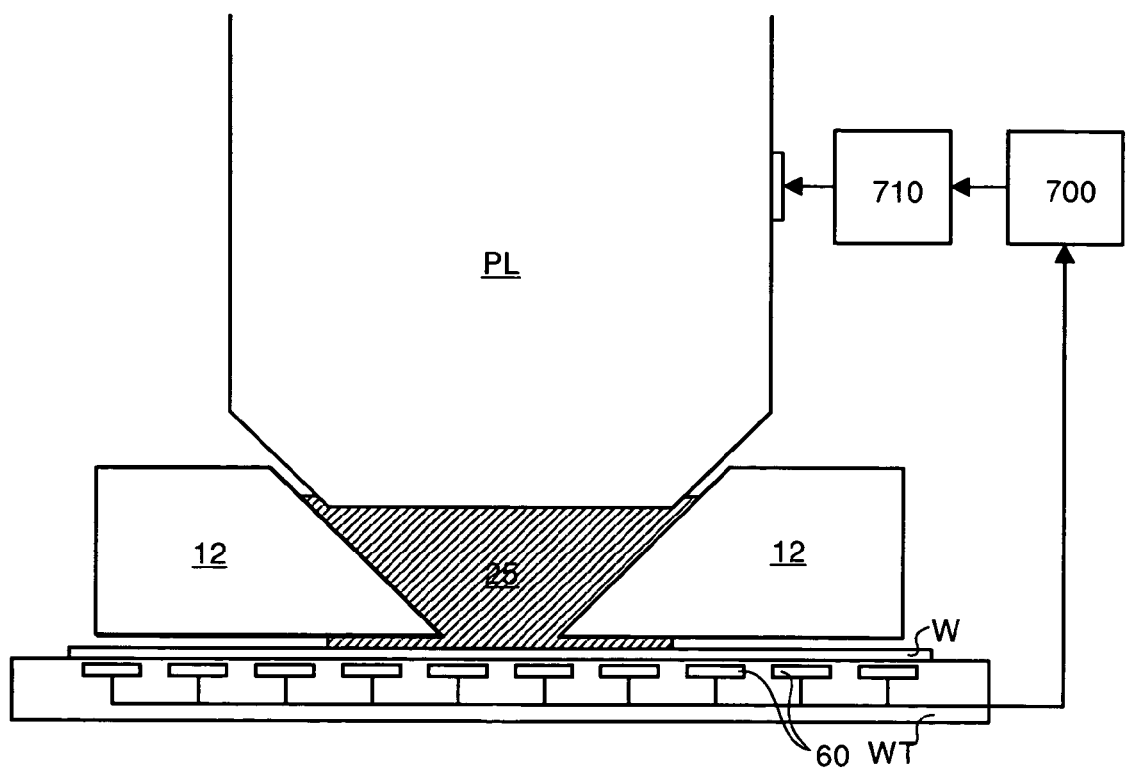
FIG. 21 depicts a projection system controller and thermally-induced-distortion calculator according to an embodiment of the invention.

FIG. 21 depicts an embodiment of the invention that includes a projection system controller 710 that is configured to adjust the properties of the patterned radiation beam in response to measurements of the substrate and/or substrate table temperatures made by temperature sensors 60. In the embodiment shown, a plurality of temperature sensors 60 are embedded in the substrate table WT. However, it would also be within the scope of the invention to provide temperature sensors elsewhere, such as in the seal member 12, and/or for only a single temperature sensor to be provided.

As discussed above, the evaporation of immersion liquid on the substrate W may lead to substrate cooling, and the resulting distortions may lead to overlay errors, defocus, aberration, etc. According to the present embodiment, the projection system controller 710 is capable of adjusting parameters of the patterned projection beam, such as its overall scaling, positional offset etc., so as to compensate for the thermally-induced distortions of the substrate W. As a simple example, if the projection system controller 710 receives input from the temperature sensors 60 indicated that the substrate W is, to a first approximation, uniformly below a target temperature, it may be configured to scale the patterned projection beam by a factor so as to reduce the size of the image generated on the cooled substrate W. Where the temperature of the substrate W and/or substrate table WT is measured by a plurality of temperature sensors 60, such that a temperature profile is obtained, more complex corrections may be implemented by the projection system controller 710 in order to reduce errors such as overlay errors, defocus, and aberration. This approach may provide a rapid way for responding to sudden changes in temperature without having to incorporate heating elements in either the seal member 12 or the substrate table WT, which may be expensive to implement and/or interfere with the dynamic performance of the substrate table WT. This form of compensation may have the added advantage of not being dependent on the particular cooling mechanism at work and may be applicable to situations in which at least a contribution to the change in temperature of the substrate W occurs due to processes other than evaporation of the immersion liquid.

In the embodiment shown in FIG. 21, a thermally-induced-distortion calculator is also provided to translate the readings taken by the temperature sensors 60 to an estimated distortion of the substrate W. This is achieved by first deriving a temperature profile of the substrate W and then using the known thermal properties of the substrate W, such as the thermal expansion coefficient of the substrate material, to calculate the thermally-induced distortion. To a first approximation, the relative distortion of a portion of the substrate W will be proportional to a temperature difference between that of the portion and a reference operating temperature (corresponding to zero relative distortion). In the embodiment shown, the temperature sensors 60 are embedded in the substrate table WT so that additional calculations need to be carried out to derive the substrate temperature profile from the temperature sensor readings. How this may be achieved is described below in relation to this and other embodiments of the invention.

A measure of the temperature of the substrate W may be determined according to several embodiments discussed above by temperature sensors 60 positioned in the substrate table WT. This arrangement may have constructional advantages, as there is relatively more space to position the sensors, they may be robustly and accurately positioned, and they may be more easily serviced by whatever electrical connections are required. As discussed earlier, positioning sensors at a distance from the substrate W in the substrate table WT may also provide an effective way to sample a larger area of substrate W per sensor 60. However, it should be understood that while the temperature of the material immediately surrounding the temperature sensor 60 may give an approximate indication of the temperature of the substrate W, it is possible to obtain a more accurate picture of the substrate temperature profile by further analysis, as described below. This analysis may be implemented as part of any of the embodiments described above including temperature sensors 60 positioned in the substrate table WT.

Assuming that the heat transport from the substrate surface to the level in the substrate table WT where the temperature sensors 60 are positioned may be described as:

$$T_\infty^{chuck} - T_{current}^{chuck} = f(\Delta T^{substrate}), \quad (1)$$

where $T_\infty^{chuck}$ is the initial temperature of the substrate W, $T_{current}^{chuck}$ is the current temperature of a region of the substrate measured by a sensor 60 embedded in the substrate table WT, and $\Delta T^{substrate}$ is the temperature difference at substrate level for the region in question, then the temperature of the substrate region, and, therefore, a temperature profile for the substrate as a whole (if required), may be obtained based on this relationship. For example, the following model may be used:

$$T_\infty^{chuck} - T_{current}^{chuck} = k \cdot e^{-\Delta T^{substrate}/\tau}, \quad (2)$$

from which it follows that $$\Delta T^{substrate} = -\tau \ln((T_\infty^{chuck} - T_{current}^{chuck})/k), \quad (3)$$

which provides an expression for the temperature difference at substrate level based only on parameters τ and k, which in turn may be estimated from test data.

Similar analyses may be used to derive a better measure of the substrate temperature from infra-red temperature sensor signals. Here, a problem is that silicon (which is frequently used as a substrate material) is significantly transparent to infra-red, so that infra-red sensors positioned in the seal member 12 "looking down" on the substrate W may receive a mixture of radiation emitted from both the substrate W and the substrate table WT immediately below it.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example, in order to create a multi-layer IC, so that the term substrate as used herein may also refer to a substrate that already contains multiple processed layers.

Although specific reference may have been made above to the use of embodiments of the invention in the context of optical lithography, it will be appreciated that the invention may be used in other applications, for example, imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" as used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The present invention may be applied to any immersion lithography apparatus, in particular, but not exclusively, those types mentioned above.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
    a substrate table constructed to hold a substrate;
    a projection system configured to project a patterned radiation beam onto a target portion of the substrate;
    a liquid supply system configured to at least partly fill a space between said projection system and said substrate with liquid;
    a barrier member arranged to at least partially contain said liquid within said space;
    a substrate table displacement system, arranged to move said substrate table along a predetermined path relative to said barrier member, thereby moving said target portion over the surface of said substrate; and
    a substrate heater configured to heat at least a portion of said substrate according to a position of said substrate table relative to said barrier member, or a velocity of said substrate table relative to said barrier member, or an acceleration of said substrate table relative to said barrier member, or a predetermined path of said substrate table relative to said barrier member, or any combination thereof.

2. The apparatus according to claim 1, wherein said substrate heater comprises an infra-red emission source, or a glow wire electrical resistance heater, or a temperature-controlled gas jet, or any combination thereof.

3. The apparatus according to claim 1, further comprising a substrate table path determining device, configured to determine said position, or said velocity, or said acceleration, or said predetermined path, or any combination thereof.

4. The apparatus according to claim 1, wherein said substrate heater comprises a plurality of remote heaters, positioned around a periphery of said barrier member, to heat the at least portion of said substrate.

5. The apparatus according to claim 4, wherein the power output of said remote heaters is controlled depending on the direction of motion of said substrate table relative to said barrier member, as determined by a substrate table path determining device.

6. The apparatus according to claim 5, wherein remote heaters at positions closest to a leading edge of said barrier member are configured to provide a lower power output than remote heaters positioned closest to a trailing edge of said barrier member.

7. The apparatus according to claim 4, further comprising
    a temperature sensor configured to measure the temperature of at least a portion of said substrate, or of at least a portion of said substrate table, or of at least a portion of a substrate holder, or any combination thereof; and
    a substrate temperature controller, arranged to control the output of each said plurality of remote heaters so as to reduce a difference between the temperature measured by said temperature sensor and a target temperature.

8. The apparatus according to claim 7, wherein the temperature sensor comprises a radiation capture and analysis device capable of determining an intensity spectrum of captured radiation over a range of wavelengths, including infra-red.

9. The apparatus according to claim 1, wherein said substrate heater comprises a local heater arranged to heat predominantly a distinct portion of said substrate, said lithographic apparatus further comprising:
a temperature sensor configured to measure a temperature of at least a portion of said substrate, or of at least a portion of said substrate table, or of at least a portion of a substrate holder, or any combination thereof; and
a substrate temperature controller, arranged to control the output of the local heater so as to reduce a difference between the temperature measured by said temperature sensor and a target temperature.

10. The apparatus according to claim 1, wherein said substrate heater comprises a liquid temperature controller arranged to interact with said liquid supply system to control the temperature of said liquid, to be filled in said space between said projection system and said substrate, to a temperature greater than about 295 K.

11. A lithographic apparatus comprising:
a substrate table constructed to hold a substrate;
a projection system configured to project a patterned radiation beam onto a target portion of the substrate;
a liquid supply system configured to at least partly fill a space between said projection system and said substrate with liquid;
a barrier member arranged to at least partially contain said liquid within said space;
a substrate table displacement system, arranged to move said substrate table along a predetermined path relative to said barrier member, thereby moving said target portion over the surface of said substrate; and
a substrate heater configured to heat at least a portion of said substrate according to a position of said substrate table relative to said barrier member, or a velocity of said substrate table relative to said barrier member, or an acceleration of said substrate table relative to said barrier member, or a predetermined path of said substrate table relative to said barrier member, or a local substrate temperature, or a local substrate table temperature, or any combination thereof,
wherein said substrate heater comprises a plurality of local heaters, each capable of heating substantially separate portions of the substrate, wherein said local heaters are arranged to be switched to a heat emitting state when positioned to heat a region of said substrate over which said barrier member has already passed, and to be switched to a non-heat emitting state when positioned to heat a region of said substrate over which said barrier member has yet to pass.

12. A lithographic apparatus comprising:
a substrate table constructed to hold a substrate;
a projection system configured to project a patterned radiation beam onto a target portion of the substrate;
a liquid supply system configured to at least partly fill a space between said projection system and said substrate with liquid;
a barrier member arranged to at least partially contain said liquid within said space;
a substrate table displacement system, arranged to move said substrate table along a predetermined path relative to said barrier member, thereby moving said target portion over the surface of said substrate; and
a substrate heater configured to heat at least a portion of said substrate according to a position of said substrate table relative to said barrier member, or a velocity of said substrate table relative to said barrier member, or an acceleration of said substrate table relative to said barrier member, or a predetermined path of said substrate table relative to said barrier member, or a local substrate temperature, or a local substrate table temperature, or any combination thereof, said substrate heater comprising a local heater arranged to heat predominantly a distinct portion of said substrate;
a temperature sensor configured to measure a temperature of at least a portion of said substrate, or of at least a portion of said substrate table, or of at least a portion of a substrate holder, or any combination thereof; and
a substrate temperature controller, arranged to control the output of the local heater so as to reduce a difference between the temperature measured by said temperature sensor and a target temperature,
wherein the local heater is arranged to be substantially aligned along a path that a target portion traverses over the substrate table when the substrate table is moved relative to said barrier member.

13. A lithographic apparatus comprising:
a substrate table constructed to hold a substrate;
a projection system configured to project a patterned radiation beam onto a target portion of the substrate;
a liquid supply system configured to at least partly fill a space between said projection system and said substrate with liquid;
a barrier member arranged to at least partially contain said liquid within said space;
a substrate table displacement system, arranged to move said substrate table along a predetermined path relative to said barrier member, thereby moving said target portion over the surface of said substrate;
a substrate heater configured to heat at least a portion of said substrate according to a position of said substrate table relative to said barrier member, or a velocity of said substrate table relative to said barrier member, or an acceleration of said substrate table relative to said barrier member, or a predetermined path of said substrate table relative to said barrier member, or a local substrate temperature, or a local substrate table temperature, or any combination thereof; and
a gas seal configured to control the amount of liquid that escapes from said barrier member through a gap delimited on one side by a boundary of said barrier member and on a second side by said substrate, said gas seal being supplied with pressurized gas by a pressurized gas supply system,
wherein said substrate heater comprises a gas temperature controller arranged to interact with said pressurized gas supply system to control the temperature of said pressurized gas supplied to said gas seal.

14. A lithographic apparatus comprising:
a substrate table constructed to hold a substrate;
a projection system configured to project a patterned radiation beam onto a target portion of the substrate;
a liquid supply system configured to at least partly fill a space between said projection system and said substrate with liquid;
a barrier member arranged to at least partially contain said liquid within said space;
a substrate table displacement system, arranged to move said substrate table along a predetermined path relative to said barrier member, thereby moving said target portion over the surface of said substrate; and a substrate heater configured to heat at least a portion of said substrate according to a position of said substrate table relative to said barrier member, or a velocity of said substrate table relative to said barrier member, or an acceleration of said substrate table relative to said barrier member, or a predetermined path of said substrate table relative to said barrier member, or a local substrate temperature, or a local substrate table temperature, or any combination thereof, wherein said substrate heater is arranged to provide a higher heating power at target regions on a substrate where the projection system is configured to project said patterned radiation beam at a first time, and progressively lower heating powers at target regions on the same substrate where the projection system is configured to project said patterned radiation beam at later times.

15. A lithographic apparatus comprising:

a substrate table constructed to hold a substrate;

a projection system configured to project a patterned radiation beam onto a target portion of the substrate;

a liquid supply system configured to at least partly fill a space between said projection system and said substrate with liquid;

a barrier member arranged to at least partially contain said liquid within said space;

a substrate table displacement system, arranged to move said substrate table along a predetermined path relative to said barrier member, thereby moving said target portion over the surface of said substrate; and a substrate heater configured to heat at least a portion of said substrate according to a position of said substrate table relative to said barrier member, or a velocity of said substrate table relative to said barrier member, or an acceleration of said substrate table relative to said barrier member, or a predetermined path of said substrate table relative to said barrier member, or a local substrate temperature, or a local substrate table temperature, or any combination thereof, wherein said substrate heater comprises elongated elements arranged in substantially parallel strips, said strips being oriented substantially perpendicular to a scanning direction of said substrate table relative to said barrier member, the separation of said strips being arranged to increase progressively from a first strip, corresponding to a region of a substrate in which the projection system is configured to project said radiation beam during a first time period, to a final strip, corresponding to a region of the same substrate in which the projection system is configured to project said radiation beam during a time period later than said first time period.

16. The apparatus according to claim 15, wherein each said substantially parallel strip provides a uniform power per unit length along its length.

17. A lithographic apparatus comprising:

a substrate table constructed to hold a substrate;

a projection system configured to project a patterned radiation beam onto a target portion of the substrate;

a liquid supply system configured to at least partly fill a space between said projection system and said substrate with liquid;

a barrier member arranged to at least partially contain said liquid within said space;

a substrate table displacement system, arranged to move said substrate table along a predetermined path relative to said barrier member, thereby moving said target portion over the surface of said substrate; and a substrate heater configured to heat at least a portion of said substrate according to a position of said substrate table relative to said barrier member, or a velocity of said substrate table relative to said barrier member, or an acceleration of said substrate table relative to said barrier member, or a predetermined path of said substrate table relative to said barrier member, or a local substrate temperature, or a local substrate table temperature, or any combination thereof, wherein said substrate heater comprises elongated elements arranged in substantially parallel strips, said strips being oriented substantially perpendicular to a scanning direction of said substrate table relative to said barrier member, and wherein said strips are arranged to provide a progressively decreasing power per unit length of strip from a first strip, corresponding to a region of a substrate in which the projection system is configured to project said radiation beam during a first time period, to a final strip, corresponding to a region of the same substrate in which the projection system is configured to project said radiation beam during a time period later than said first time period.

18. A lithographic apparatus comprising:

a substrate table constructed to hold a substrate;

projection system configured to project a patterned radiation beam onto a target portion of the substrate;

a liquid supply system configured to at least partly fill a space between said projection system and said substrate with liquid;

a barrier member arranged to at least partially contain said liquid within said space;

a substrate table displacement system, arranged to move said substrate table along a predetermined path relative to said barrier member, thereby moving said target portion over the surface of said substrate; and a substrate heater configured to heat at least a portion of said substrate according to a position of said substrate table relative to said barrier member, or a velocity of said substrate table relative to said barrier member, or an acceleration of said substrate table relative to said barrier member, or a predetermined path of said substrate table relative to said barrier member, or a local substrate temperature, or a local substrate table temperature, or any combination thereof, wherein said substrate heater comprises an array of individually addressable local heaters and a heater array controller adapted to control actuation of said individually addressable local heaters according to a predetermined algorithm, said predetermined algorithm controlling actuation with respect to a heater position relative to the barrier member, or heater movement timing, or any combination thereof.

19. A lithographic apparatus comprising:

a substrate table constructed to hold a substrate;

a projection system configured to project a patterned radiation beam onto a target portion of the substrate;

a liquid supply system configured to at least partly fill a space between said projection system and said substrate with liquid;

a barrier member arranged to at least partially contain said liquid within said space between said projection system and said substrate;

a substrate table heat-exchange fluid controller configured to control a temperature of a heat-exchange fluid arranged to flow through a network of channels embedded in said substrate table, to below a desired temperature of the substrate; and a substrate heater controller configured to control a plurality of local substrate heaters, embedded in said substrate table, to apply heat when a measured temperature drops below a certain temperature.

20. The apparatus according to claim 19, further comprising a temperature sensor arranged to measure the temperature of at least a portion of said substrate, or of at least a portion of said substrate table, or of at least a portion of a substrate holder, or any combination thereof, and wherein said heat-exchange fluid controller is arranged to control the temperature, or a flow rate, or both, of said heat-exchange fluid so as to reduce a difference between a target temperature and the temperature as measured by said temperature sensor.

21. The apparatus according to claim 20, wherein the substrate heater controller is arranged to control the output of at least one of the plurality of local substrate heaters so as to reduce the difference between the target temperature and the measured temperature.

22. A lithographic apparatus comprising:
a substrate table constructed to hold a substrate;
a projection system configured to project a patterned radiation beam onto a target portion of the substrate;
a liquid supply system configured to at least partly fill a space between said projection system and said substrate with liquid;
a barrier member arranged to at least partially contain said liquid within said space between said projection system and said substrate; and
a substrate table heat-exchange fluid controller configured to control a temperature and flow rate of a heat-exchange fluid arranged to flow through a network of channels embedded in said substrate table,
wherein said network of channels comprises an array of substantially straight holes oriented in a plane of the substrate table, each being arranged to open out into a peripheral groove provided around a peripheral edge of said substrate table, said lithographic apparatus further comprising:
a substrate table channel closing member configured to be fixable in a cooperative manner into said peripheral groove so as to connect together said substantially straight holes to form said network of channels.

23. A device manufacturing method comprising:
projecting a patterned radiation beam through a liquid onto a target portion of a substrate supported by a substrate table;
moving said substrate table along a predetermined path relative to a barrier member used to at least partially contain the liquid, thereby moving said target portion over a surface of said substrate; and
heating at least a portion of said substrate according to a position of said substrate table relative to said barrier member, or a velocity of said substrate table relative to said barrier member, or an acceleration of said substrate table relative to said barrier member, or a predetermined path of said substrate table relative to said barrier member, or any combination thereof.

24. The method according to claim 23, comprising performing the heating using an infra-red emission source, or a glow wire electrical resistance heater, or a temperature-controlled gas jet, or any combination thereof.

25. The method according to claim 23, comprising performing the heating using a plurality of local heaters, each capable of heating substantially separate portions of the substrate, wherein the local heaters are switched to a heat emitting state when positioned to heat a region of the substrate over which the barrier member has already passed, and switched to a non-heat emitting state when positioned to heat a region of the substrate over which the barrier member has yet to pass.

26. The method according to claim 23, further comprising determining the position of said substrate table relative to said barrier member, or the velocity of said substrate table relative to said barrier member, or the acceleration of said substrate table relative to said barrier member, or the predetermined path of said substrate table relative to said barrier member, or any combination thereof.

27. The method according to claim 23, comprising performing the heating using a local heater arranged to heat predominantly a distinct portion of the substrate, and further comprising:
measuring a temperature of at least a portion of the substrate, or of at least a portion of the substrate table, or of at least a portion of a substrate holder, or any combination thereof; and
controlling the output of the local heater so as to reduce a difference between the measured temperature and a target temperature.

28. The method according to claim 27, wherein the local heater is substantially aligned along a path that a target portion traverses over the substrate table when the substrate table is moved relative to the barrier member.

29. The method according to claim 23, further comprising controlling the temperature of the liquid to a temperature greater than about 295 K.

30. The method according to claim 23, further comprising controlling the amount of liquid that escapes from the barrier member through a gap, delimited on one side by a boundary of the barrier member and on a second side by the substrate, by supplying a pressurized gas, and controlling the temperature of the supplied pressurized gas to a temperature greater than about 300 K.

31. The method according to claim 23, wherein the heating comprises providing a higher heating power at target regions on a substrate where the patterned radiation beam is projected at a first time, and progressively lower heating powers at target regions on the same substrate where the patterned radiation beam is projected at later times.

32. The method according to claim 23, wherein the heating is performed using elongated elements arranged in substantially parallel strips, the strips being oriented substantially perpendicular to a scanning direction of the substrate table relative to the barrier member, the separation of the strips being arranged to increase progressively from a first strip, corresponding to a region of a substrate where the patterned radiation beam is projected during a first time period, to a final strip, corresponding to a region of the same substrate where the patterned beam is projected during a time period later than the first time period.

33. The method according to claim 32, wherein each substantially parallel strip provides a uniform power per unit length along its length.

34. The method according to claim 23, comprising performing the heating using elongated elements arranged in substantially parallel strips, the strips being oriented substantially perpendicular to a scanning direction of the substrate table relative to the barrier member, and wherein the strips are arranged to provide a progressively decreasing power per unit length of strip from a first strip, corresponding to a region of a substrate where the patterned beam is projected during a first time period, to a final strip, corresponding to a region of the same substrate where the patterned beam is projected during a time period later than the first time period.

35. The method according to claim 23, comprising performing the heating using an array of individually addressable local heaters and further comprising controlling actuation of the individually addressable local heaters according to a predetermined algorithm, the predetermined algorithm controlling actuation with respect to a heater position, or timing, or an amount of heat generated, or a rate of heat generated, or any combination thereof.

36. A device manufacturing method comprising:
projecting a patterned radiation beam with a projection system onto a target portion of a substrate supported by a substrate table;
at least partially filling a space between said projection system and said substrate with liquid; and
controlling (i) a temperature of a heat-exchange fluid arranged to flow through a network of channels embedded in said substrate table, to below a desired temperature of the substrate; and (ii) a plurality of local substrate heaters, embedded in said substrate table, to apply heat when a measured temperature drops below a certain temperature.

37. The method according to claim 36, wherein the network of channels comprises an array of substantially straight holes oriented in a plane of the substrate table, each being arranged to open out into a peripheral groove provided around a peripheral edge of the substrate table, and further comprising a substrate table channel closing member fixable in a cooperative manner into the peripheral groove so as to connect together the substantially straight holes to form the network of channels.

38. The method according to claim 36, further comprising measuring the temperature of at least a portion of the substrate, or of at least a portion of the substrate table, or of at least a portion of a substrate holder, or any combination thereof, and controlling the temperature or a flow rate, or both, of the heat-exchange fluid so as to reduce a difference between a target temperature and the measured temperature.

39. The method according to claim 38, wherein the controlling comprises controlling the output of at least one of the plurality of local substrate heaters so as to reduce the difference between the target temperature and the measured temperature.

* * * * *